(12) United States Patent
Ogiwara et al.

(10) Patent No.: US 11,744,088 B2
(45) Date of Patent: Aug. 29, 2023

(54) MEMORY DEVICE

(71) Applicant: Kioxia Corporation, Tokyo (JP)

(72) Inventors: Ryu Ogiwara, Yokohama Kanagawa (JP); Daisaburo Takashima, Yokohama Kanagawa (JP); Takahiko Iizuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 147 days.

(21) Appl. No.: 17/495,103

(22) Filed: Oct. 6, 2021

(65) Prior Publication Data

US 2022/0109024 A1 Apr. 7, 2022

(30) Foreign Application Priority Data

Oct. 7, 2020 (JP) .................................. 2020-169816

(51) Int. Cl.
| | |
|---|---|
| *G11C 13/00* | (2006.01) |
| *H10B 63/00* | (2023.01) |
| *H10N 70/20* | (2023.01) |
| *H10N 70/00* | (2023.01) |

(52) U.S. Cl.
CPC ....... *H10B 63/845* (2023.02); *G11C 13/0004* (2013.01); *G11C 13/004* (2013.01); *H10B 63/34* (2023.02); *H10N 70/231* (2023.02); *H10N 70/8828* (2023.02); *G11C 2213/71* (2013.01); *G11C 2213/79* (2013.01)

(58) Field of Classification Search
CPC ...... H10B 63/845; H10B 63/34; H10B 63/30; H10N 70/231; H10N 70/8828; H10N 70/823; H10N 70/882; G11C 13/0004; G11C 13/004; G11C 2213/71; G11C 2213/79

USPC ......................................................... 365/163
See application file for complete search history.

(56) References Cited

U.S. PATENT DOCUMENTS

| | | |
|---|---|---|
| 5,894,447 A | 4/1999 | Takashima |
| 9,025,369 B2 | 5/2015 | Takashima |
| 9,966,136 B2 | 5/2018 | Ogiwara et al. |
| 2012/0243307 A1* | 9/2012 | Takashima ........... H10N 70/231 257/E27.081 |

(Continued)

OTHER PUBLICATIONS

Kim, et al., "Multi-Layered Vertical Gate NANO Flash Overcoming Stacking Limit for Terabit Density Storage", Symposium on VLSI Technology Digest of Technical Papers, pp. 188-189, 2009.

(Continued)

*Primary Examiner* — Fernando Hidalgo
(74) *Attorney, Agent, or Firm* — Holtz, Holtz & Volek PC

(57) ABSTRACT

According to one embodiment, a memory device includes: a first variable resistance layer; first and second semiconductor layers being in contact with the first variable resistance layer; a first word line; a second word line being adjacent to the first word line; and a third word line being adjacent to the first and second word lines with the first semiconductor layer, the first variable resistance layer, and the second semiconductor layer interposed therebetween, and provided between the first word line and the second word line. In the first variable resistance layer, a first region including a shortest path connecting the first word line and the third word line functions as a first memory cell, and a second region including a shortest path connecting the third word line and the second word line functions as a second memory cell.

20 Claims, 33 Drawing Sheets

(56) References Cited

U.S. PATENT DOCUMENTS

2018/0358056 A1* 12/2018 Lee .................. H10B 61/10
2019/0244662 A1* 8/2019 Lee .................. H10B 63/30
2020/0161328 A1* 5/2020 Yoon ................. H10B 63/34
2020/0403035 A1 12/2020 Ogiwara et al.

OTHER PUBLICATIONS

Kinoshita, et al., "Scalable 3-D vertical chain-cell type phase-change memory with 4F2 poly-Si diodes", Symposium on VLSI Technology Digest of Technical Papers, pp. 35-36, 2012.
U.S. Appl. No. 17/348,839, First Named Inventor: Takahiko Iizuka; Title: "Memory Device and Method of Manufacturing Memory Device"; filed Jun. 16, 2021.
U.S. Appl. No. 17/443,586, First Named Inventor: Ryu Ogiwara; Title: "Memory Device"; filed Jul. 27, 2021.

* cited by examiner

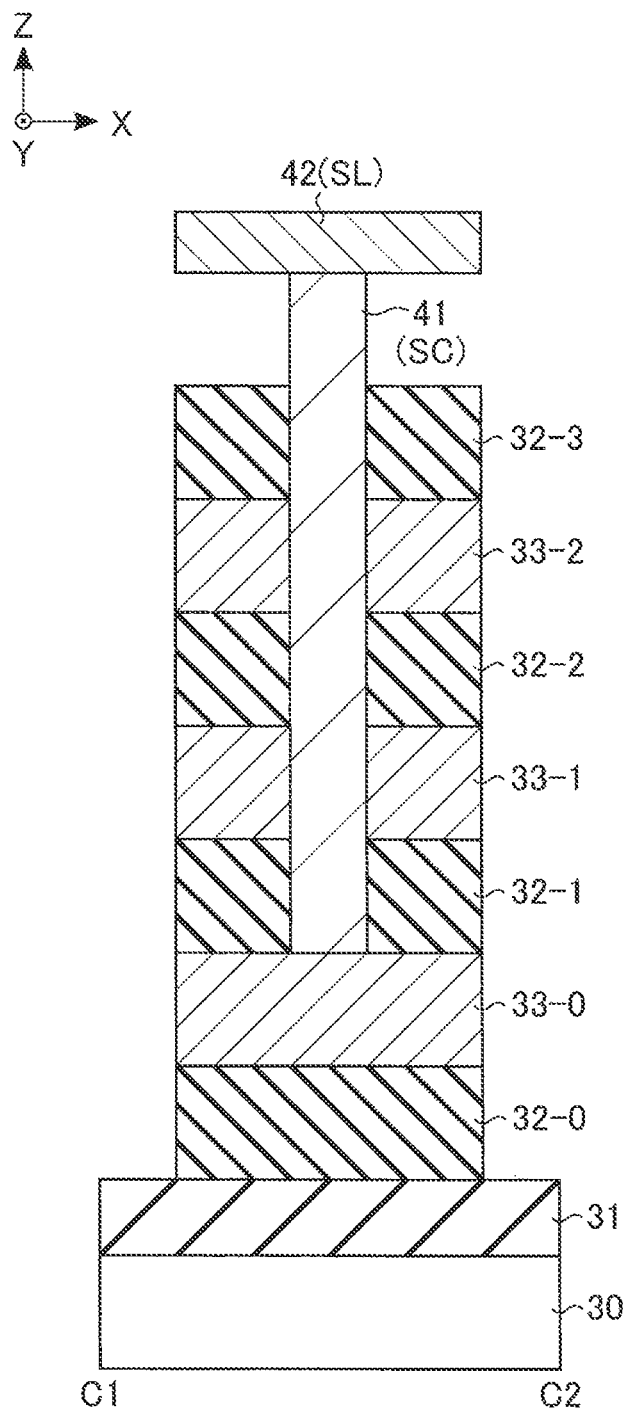
F I G. 7

FIG. 10

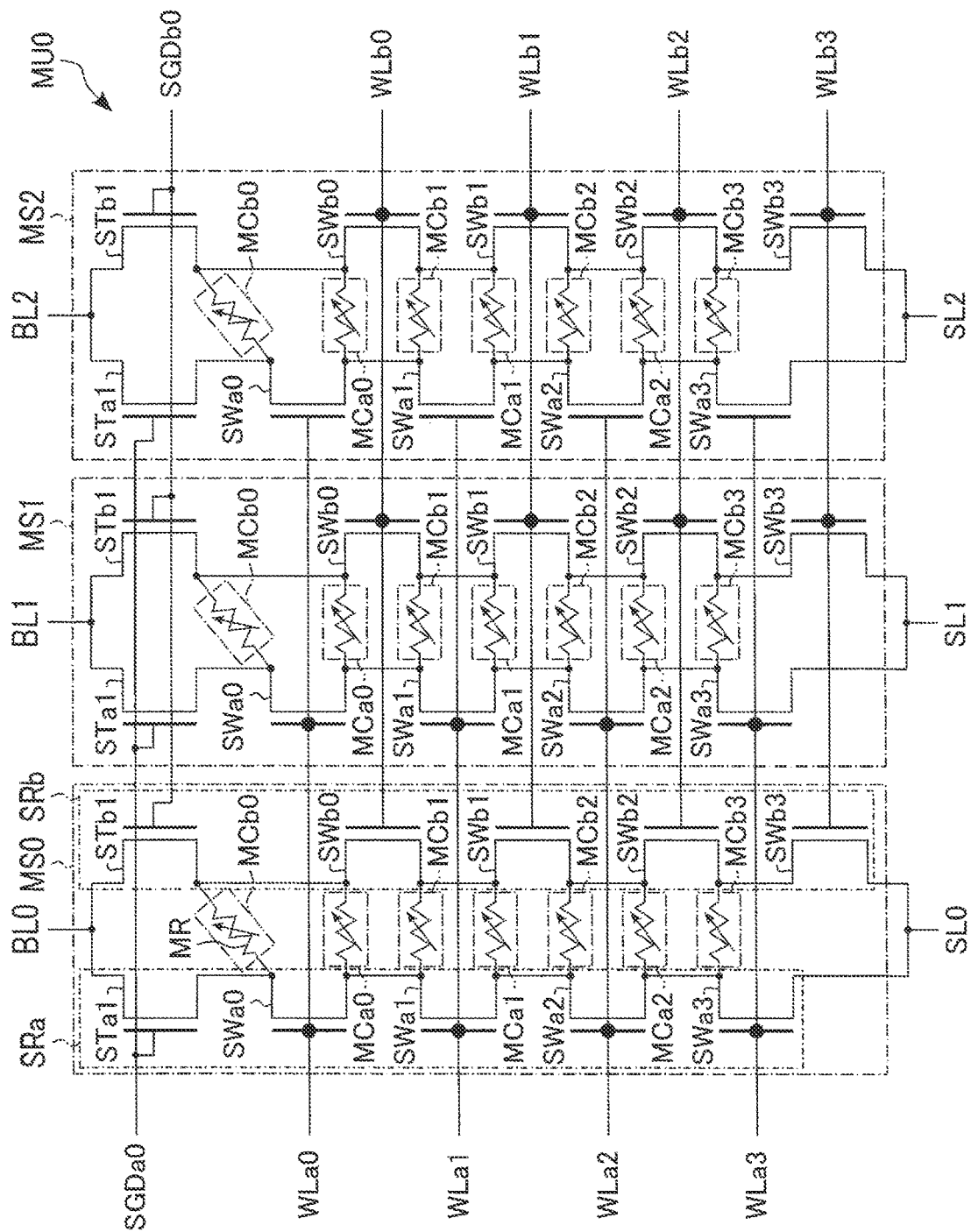
F I G. 19

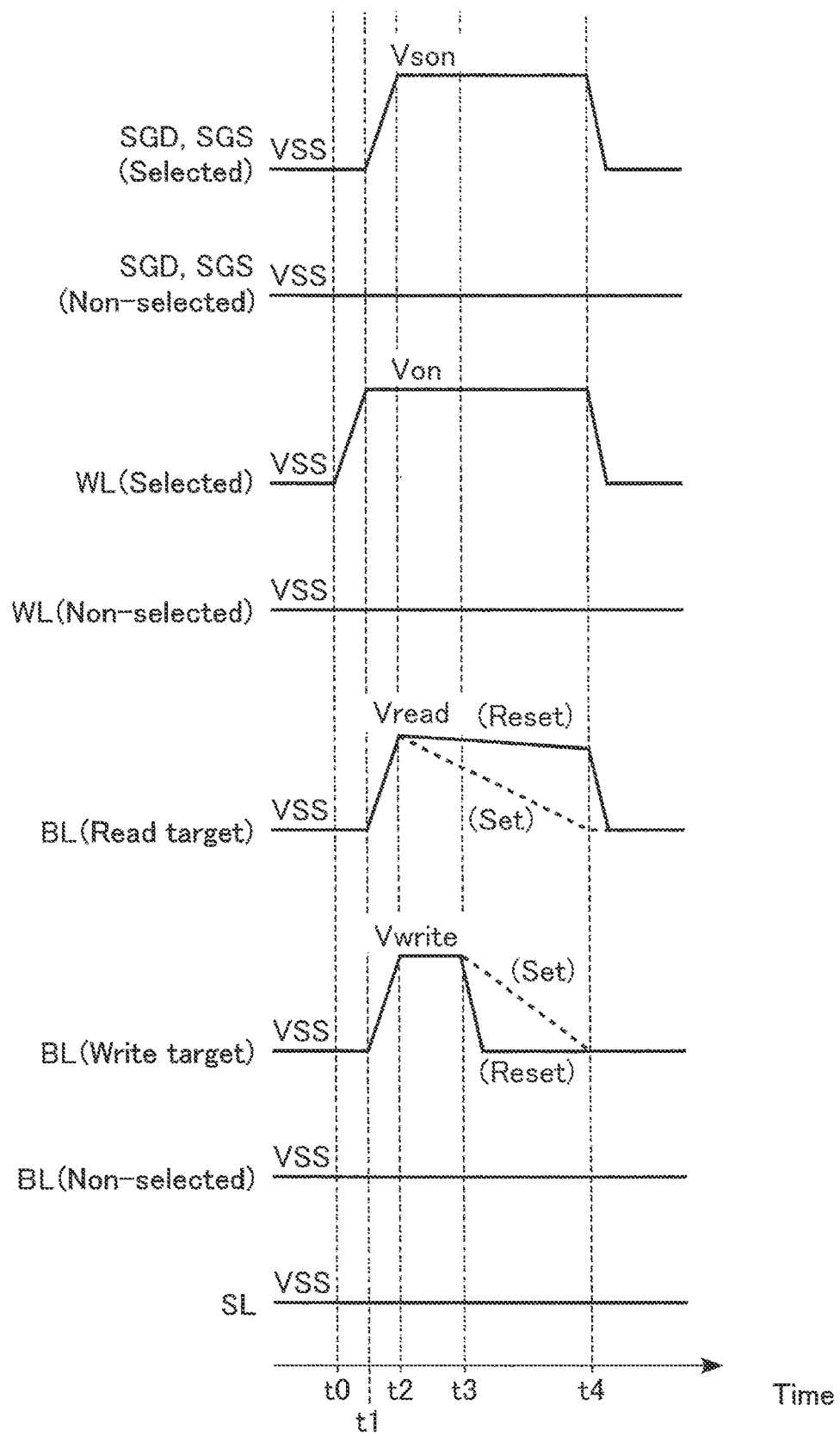
F I G. 25

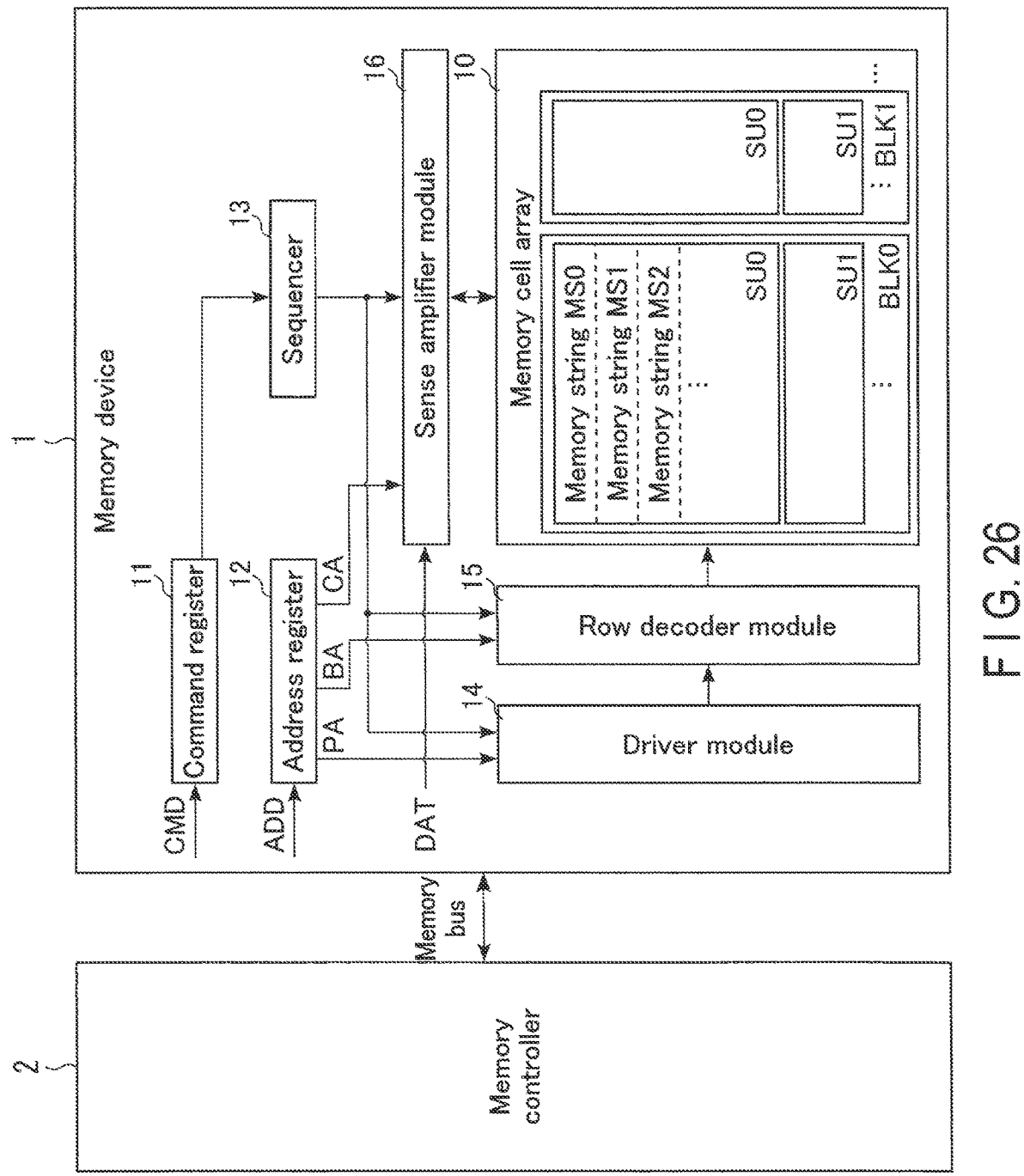
F I G. 26

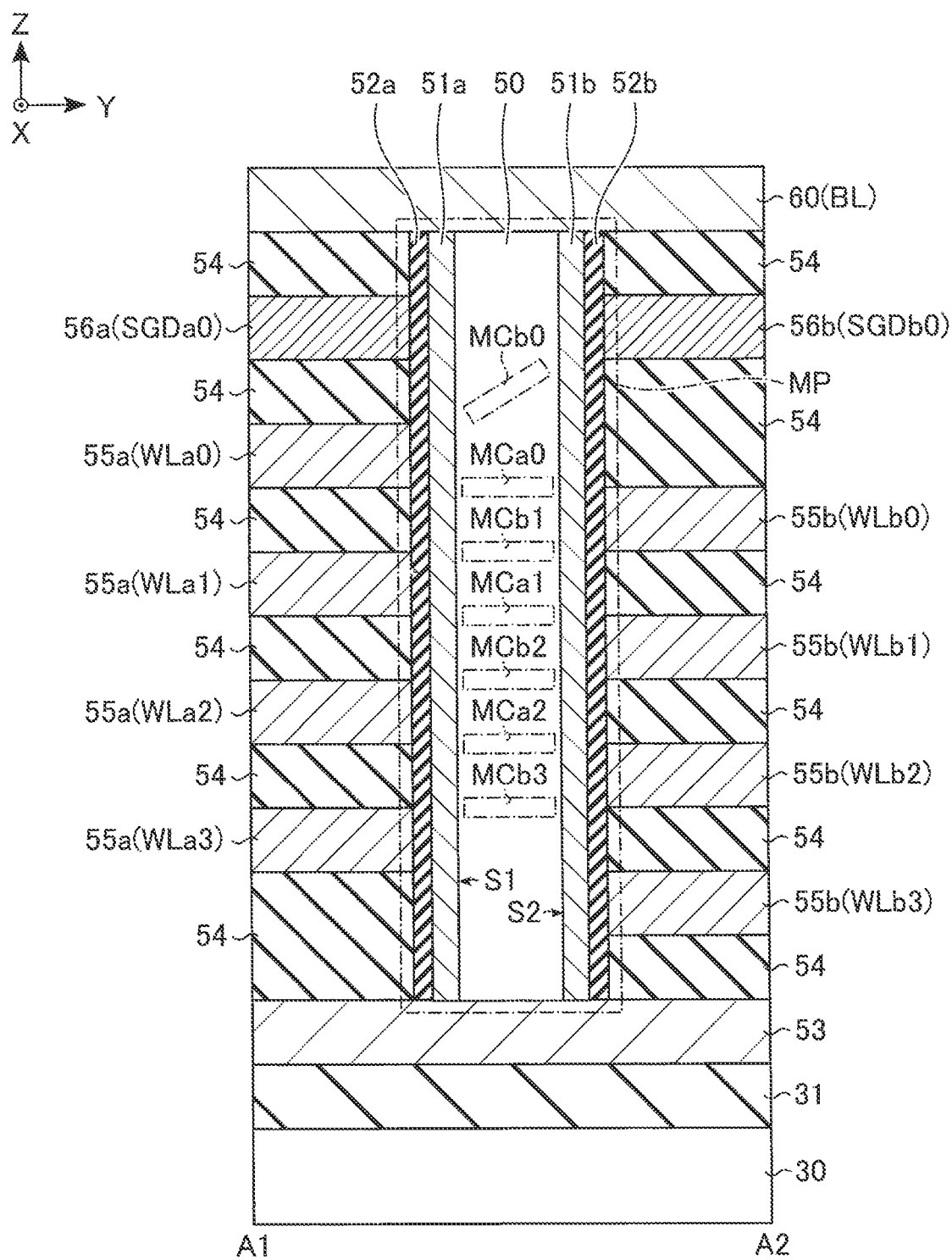
F I G. 29

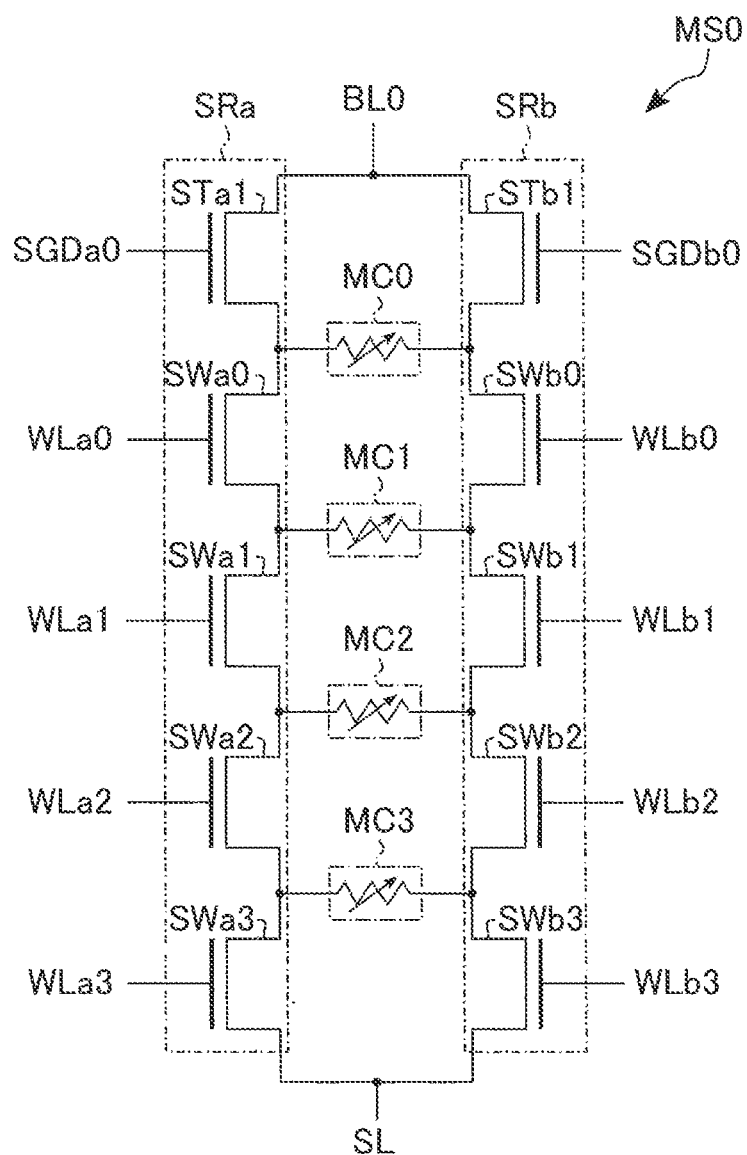
F I G. 30

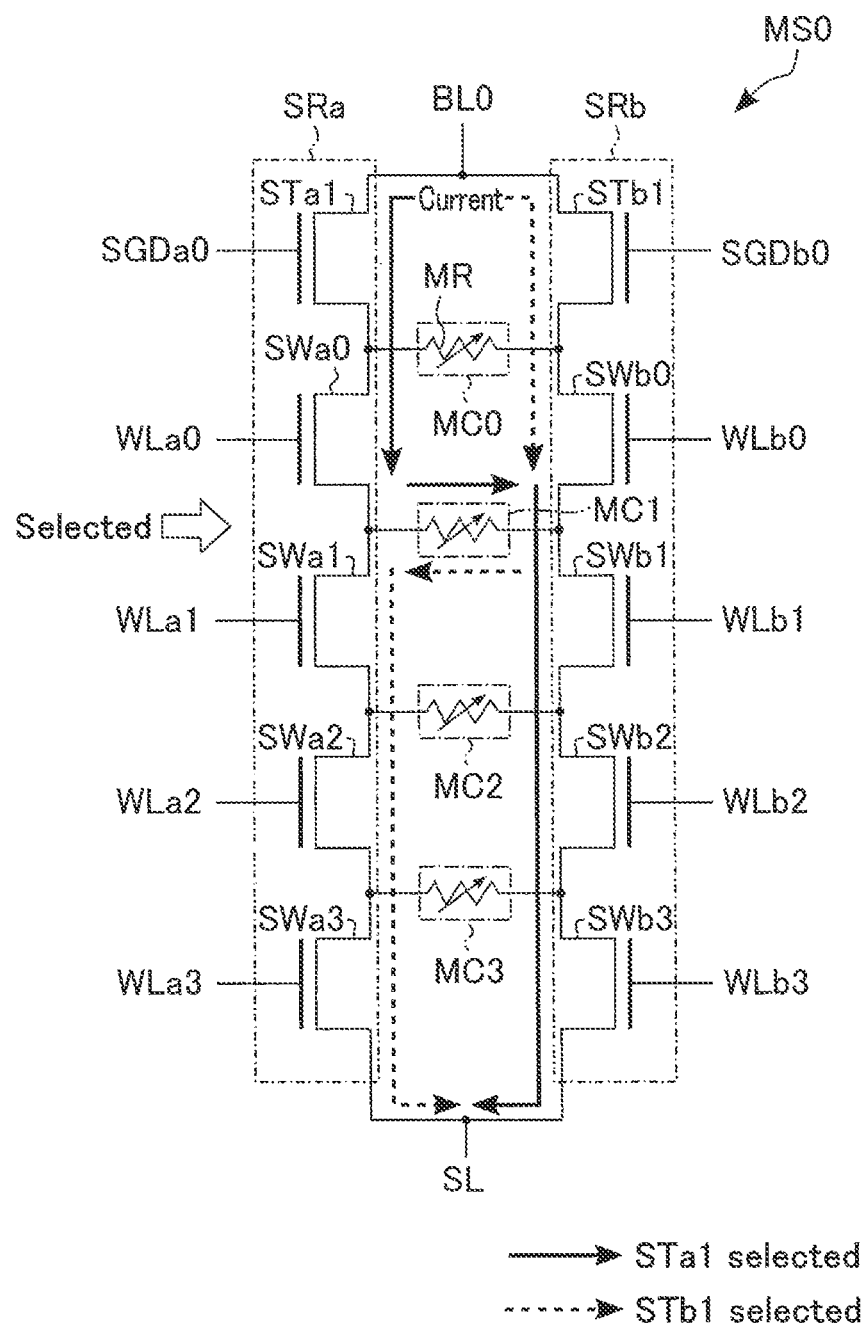
F I G. 33

MEMORY DEVICE

CROSS-REFERENCE TO RELATED APPLICATIONS

This application is based upon and claims the benefit of priority from Japanese Patent Application No. 2020-169816, filed Oct. 7, 2020, the entire contents of which are incorporated herein by reference.

FIELD

Embodiments described herein relate generally to a memory device.

BACKGROUND

Memory devices (semiconductor integrated circuit devices) in which variable resistance memory elements such as resistive random access memory (ReRAM) elements, alloy-based phase-change memory (PCM) elements, interfacial phase-change memory (iPCM) elements, and conductive-bridge RAM (CBRAM) elements are integrated on a semiconductor substrate have been proposed.

BRIEF DESCRIPTION OF THE DRAWINGS

FIG. 7 is a cross-sectional view taken along line C1-C2 of FIG. 4.

FIG. 10 is a table showing a relationship among selected memory cells, select transistors, and selectors SW in the memory device according to the first embodiment.

FIG. 19 is a circuit diagram of a memory cell array included in a memory device according to a sixth embodiment.

FIG. 25 is a timing chart showing voltages of interconnects during a write operation and a read operation in the memory device according to the seventh embodiment.

FIG. 26 is a block diagram of a memory device according to an eighth embodiment.

FIG. 29 is a cross-sectional view taken along line A1-A2 of FIG. 28.

FIG. 30 is a circuit diagram of a memory cell array included in a memory device according to a ninth embodiment.

FIG. 33 is a circuit diagram of a memory string showing a selected state of a memory cell in the memory cell array included in the memory device according to the ninth embodiment.

DETAILED DESCRIPTION

In general, according to one embodiment, a memory device includes: a first variable resistance layer extending in a first direction; a first semiconductor layer extending in the first direction and being in contact with a first main surface of the first variable resistance layer, the first main surface facing a second direction intersecting the first direction; a second semiconductor layer extending in the first direction and being in contact with a second main surface of the first variable resistance layer, the second main surface facing the second direction; a first word line extending in a third direction intersecting the first and second directions; a second word line extending in the third direction and being adjacent to the first word line along the first direction; a third word line extending in the third direction, being adjacent to the first and second word lines with the first semiconductor layer, the first variable resistance layer, and the second semiconductor layer interposed therebetween, and provided between the first word line and the second word line in the first direction; a first insulating layer provided between the first semiconductor layer and the first word line; a second insulating layer provided between the first semiconductor layer and the second word line; and a third insulating layer provided between the second semiconductor layer and the third word line. In the first variable resistance layer, a first region including a shortest path connecting the first word line and the third word line functions as a first memory cell, and a second region including a shortest path connecting the third word line and the second word line functions as a second memory cell.

Hereinafter, embodiments will be described with reference to the drawings. In the following descriptions, structural elements that have approximately the same functions and configurations will be denoted by the same reference signs, and a repeat description of such elements will be given only where necessary. Each of the embodiments described below merely indicates an exemplary apparatus or method for embodying the technical idea of the embodiment. The element materials, shapes, structures, arrangements, etc. of the technical ideas of the embodiments are not limited to those described below. The technical ideas of the embodiments may be varied within the scope of the claims.

1. First Embodiment

A memory device according to a first embodiment will be described. Hereinafter, a memory device in which memory cells are three-dimensionally stacked above a semiconductor substrate will be described as an example of the memory device. The memory cells may be arranged two dimensionally on a plane parallel to the semiconductor substrate.

1.1 Configuration 1.1.1 Overall Configuration of Memory Device

Figure 1:
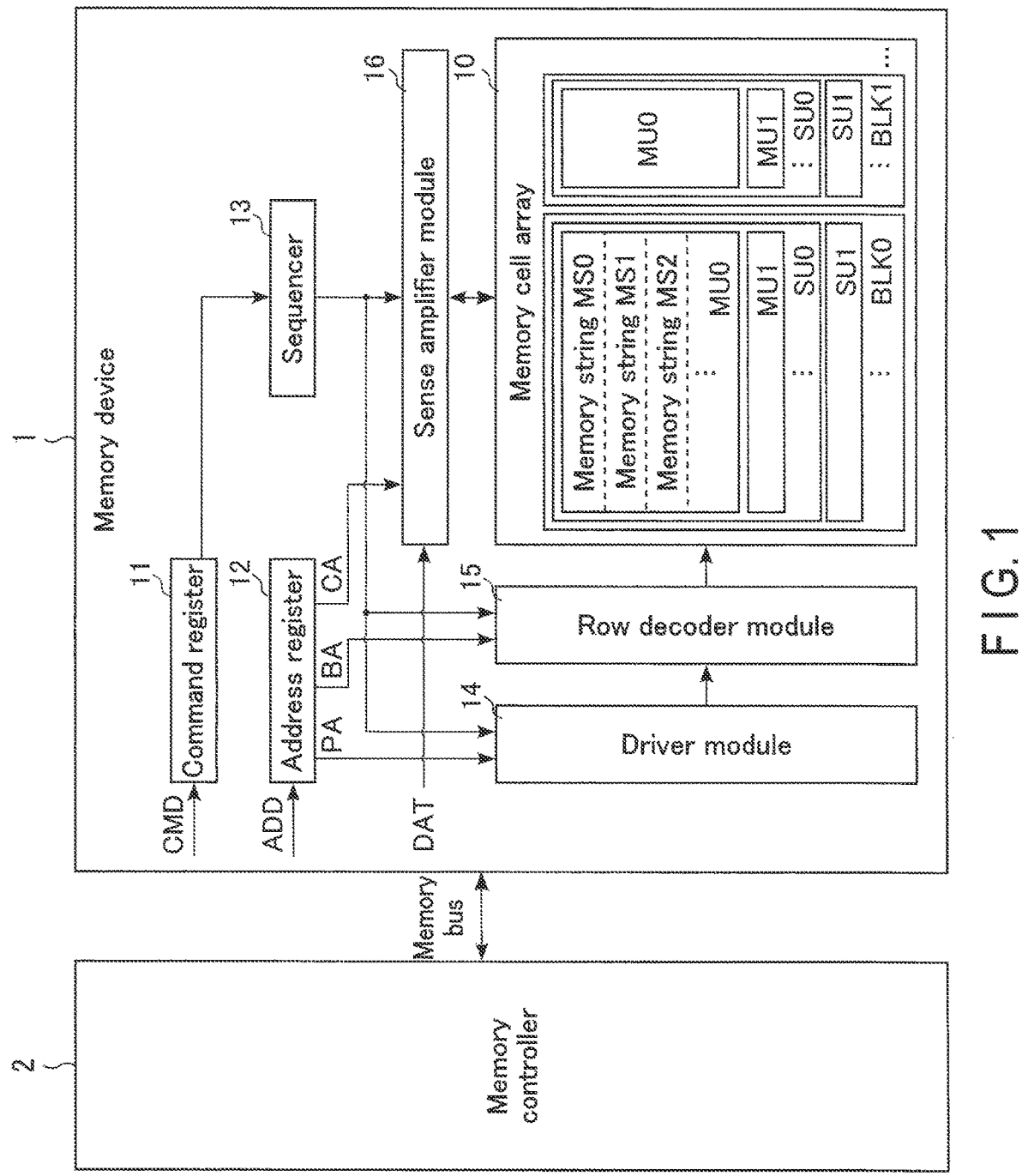
FIG. 1 is a block diagram of a memory device according to a first embodiment.

First, an overall configuration of the memory device will be described with reference to FIG. 1. FIG. 1 is an example of a block diagram showing a basic overall configuration of the memory device.

As shown in FIG. 1, a memory device 1 is, for example, coupled to an external memory controller 2 via a memory bus. The memory device 1 is, for example, controlled by the external memory controller 2 in a write operation, a read operation, etc. The memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK (BLK0, BLK1, . . . ). A block BLK is a set of a plurality of memory cells capable of storing data in a nonvolatile manner. Each block BLK includes a plurality of string units SU (SU0, SU1, . . . ). Each string unit SU includes a plurality of memory units MU (MU0, MU1, . . . ). The memory unit MU includes a plurality of memory strings MS stacked above a semiconductor substrate. For example, the memory unit MU0 includes memory strings MS0, MS1, and MS2. The memory string MS includes a plurality of memory cells associated with one bit line. The memory cell is associated with word lines and a bit line. Any number of blocks BLK, string units SU, memory units MU, and memory strings MS may be provided in the memory cell array 10. A detailed configuration of the memory cell array 1C will be described later.

The command register 11 stores a command CMD received by the memory device 1 from the memory controller 2. The command CMD includes, for example, an instruction to cause the sequencer 13 to execute a write operation, a read operation, etc.

The address register 12 stores address information ADD received by the memory device 1 from the memory controller 2. The address information ADD includes, for example, a block address BA, a page address PA, and a column address CA. For example, the block, address BA, page address PA, and column address CA are used for selection of a block BLK, a word line, and a bit line, respectively.

The sequencer 13 controls the overall operation of the memory device 1. For example, the sequencer 13 controls the driver module 14, row decoder module 15, and sense amplifier module 16, etc., based on a command CMD stored in the command register 11, to execute the write operation, the read operation, etc.

The driver module 14 generates voltages to be used for the write operation, the read operation, etc. The driver module 14, for example, applies the generated voltage to a signal line corresponding to a selected word line based on a page address PA stored in the address register 12.

The row decoder module 15 selects one corresponding block BLK in the memory cell array 10 based on a block address BA stored in the address register 12. The row decoder module 15, for example, transfers the voltage applied to the signal line corresponding to the selected word line to the selected word line in the selected block BLK.

The sense amplifier module 16 applies a voltage to each bit line based on write data DAT received from the memory controller 2, in the write operation. In the read operation, the sense amplifier module 16 determines data stored in a memory cell based on the voltage of the bit line, and transfers the determination result to the memory controller 2 as read data DAT.

The memory device 1 and memory controller 2 as described above may be combined to constitute one semiconductor device. Examples of such semiconductor devices include a memory card such as an SD™ card and a solid state drive (SSD).

1.1.2 Circuit Configuration of Memory Cell Array

Figure 2:
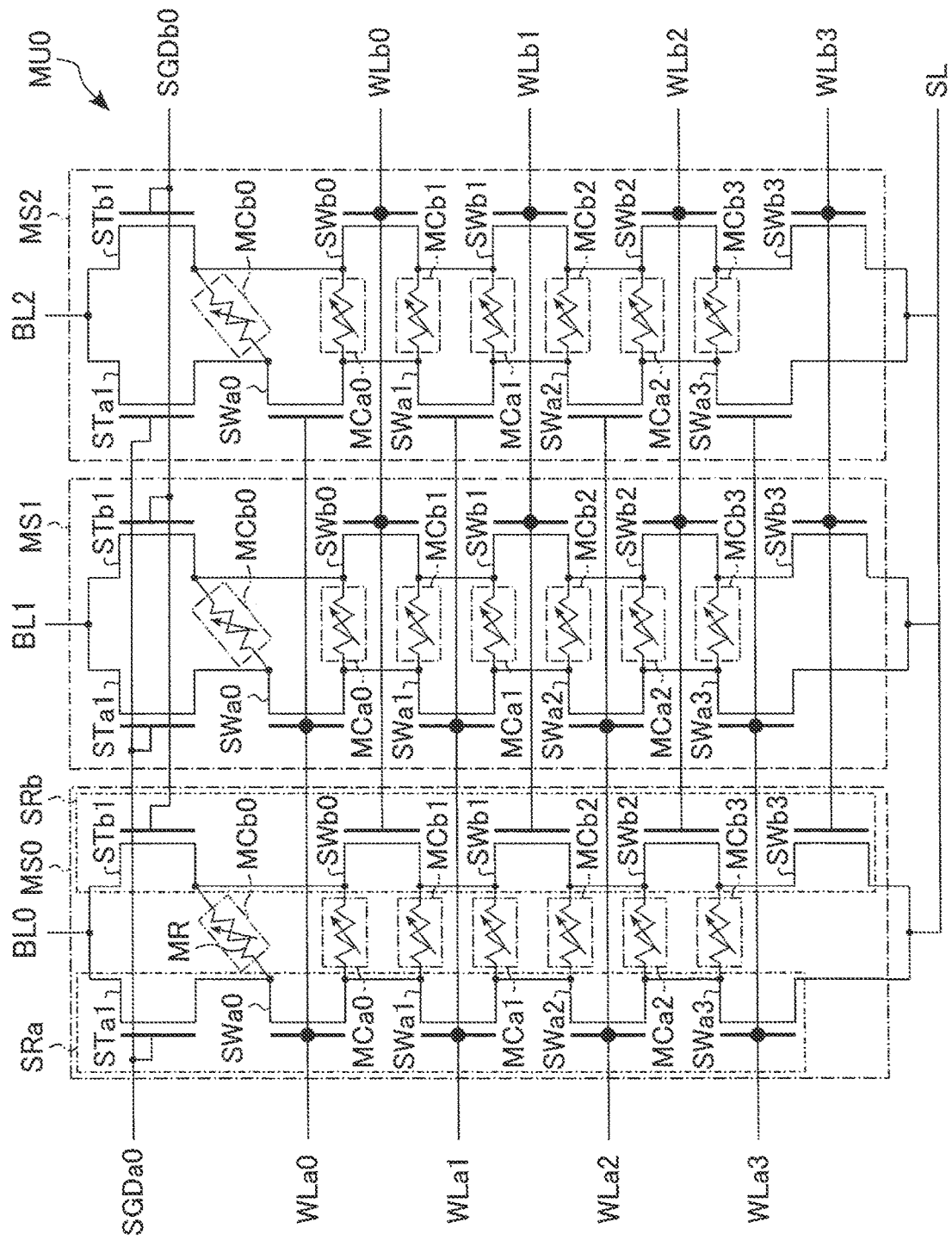
FIG. 2 is a circuit diagram of a memory cell array included in the memory device according to the first embodiment.

Next, an example circuit configuration of the memory cell array 10 will be described with reference to FIG. 2. FIG. 2 shows a circuit configuration of the memory unit MU0. The configurations of the other memory units MU are the same.

As shown in FIG. 2, the memory unit MU0 includes, for example, three memory strings MS0 to MS2.

The memory strings MS within the string unit SU are respectively associated with different bit lines BL. Moreover, the memory strings MS within the string units SU are coupled in common to a source line SL. More specifically, one ends of the memory strings MS0 to MS2 are coupled to different bit lines BL0 to BL2, respectively, and the other ends are coupled in common to the source line SL. The plurality of bit lines BL are independently controlled by the sense amplifier module 16.

Each memory string MS includes two strings SRa and SRb, and a plurality of memory cells MC (seven memory cells MCa0 to MCa2 and MCb0 to MCb3 in the example of FIG. 2) are provided between the strings SRa and SRb.

The string SRa includes a select transistor STa1 and a plurality of selectors SWa (four selectors SWa0 to SWa3 in the example of FIG. 2). Similarly, the string SRb includes a select transistor STb1 and a plurality of selectors SWb (four selectors SWb0 to SWb3 in the example of FIG. 2). Each of the select transistors STa1 and STb1 is turned on when a corresponding string SR is selected. The selector SW is used to select a current path when selecting a memory cell MC. Hereinafter, the strings SRa and SRb will each be referred to as a string SR when a distinction is not made therebetween. The memory cells MCa0 to MCa2 and MCb0 to MCb3 will each be referred to as a memory cell MC when a distinction is not made therebetween. The select transistors STa1 and STb1 will each be referred to as a select transistor ST1 when a distinction is not made therebetween. In addition, the selectors SWa0 to SWa3 and SWb0 to SWb3 will each be referred to as a selector SW when a distinction is not made therebetween. The number of selectors SW included in the memory string MS can be freely designed. The number of memory cells MC included in the memory string MS is discretionary, and depends on the number and arrangement of selectors SW.

More specifically, for example, in the string SRa, current paths of the select transistor STa1 and selectors SWa0 to SWa3 are coupled in series in this order. Likewise, in the string SRb, current paths of the select transistor STb1 and selectors SWb0 to SWb3 are coupled in series in this order. The drains of the select transistors STa1 and STb1 included in one memory string MS are coupled in common to one bit line BL. The sources of the selectors SWa3 and SWb3 included in one memory string MS are coupled in common to the source line SL.

In each string unit SU, the gates of a plurality of select transistors STa1 are coupled in common to a select gate line SGDa, and the gates of a plurality of select transistors STb1 are coupled in common to a select gate line SGDb. More specifically, for example, in the string unit SU0, the gates of a plurality of select transistors STa1 are coupled in common to a select gate line SGDa0, and the gates of a plurality of select transistors STb1 are coupled in common to a select gate line SGDb0. For example, in the write operation and the read operation, memory cells MC are selected in units of a string unit SU that shares select gate lines SGDa and SGDb.

In each string unit SU, the select gate lines SGDa and SGDb are independently controlled by the row decoder module 15.

For example, the gates of a plurality of selectors SWa0 to SWa3 and SWb0 to SWb3 in the same block BLK are coupled in common to word lines WLa0 to WLa3 and WLb0 to WLb3 provided for each block BLK, respectively. The word lines WLa0 to WLa3 and WLb0 to WLb3 are independently controlled by the row decoder module 15. Hereinafter, the word lines WLa0 to WLa3 and WLb0 to WLb3 will be respectively referred to as the word line WL, unless specified.

In the present embodiment, in the write operation and the read operation, when a current (a write current and a read current) is passed from the bit line BL to the source line SL via the memory string MS, memory cells MCa (MCa0 to MCa2) are provided on a current path through which the current is passed from the string SRa to the string SRb. In addition, memory cells MCb (memory cells MCb0 to MCb3) are provided on a current path through which a current is passed from the string SRb to the string SRa. More specifically, when a current is passed from the string SRa to the string SRb, the memory cell MCa0 is provided on a current path connecting the source of the selector SWa0 and the drain of the selector SWb0. The memory cell MCa1 is provided on a current path connecting the source of the selector SWa1 and the drain of the selector SWb1. The memory cell MCa2 is provided on a current path connecting the source of the selector SWa2 and the drain of the selector SWb2. When a current is passed from the string SRb to the string SRa, the memory cell MCb0 is provided on a current path connecting the source of the select transistor STb1 and the drain of the selector SWa0. The memory cell MCb1 is provided on a current path connecting the source of the selector SWb0 and the drain of the selector SWa1. The memory cell MCb2 is provided on a current path connecting the source of the selector SWb1 and the drain of the selector SWa2. The memory cell MCb3 is provided on a current path connecting the source of the selector SWb2 and the drain of the selector SWa3.

Each memory cell MC includes a memory element (variable resistance memory region/variable resistance layer/variable resistance element) MR. An example of the memory element MR is an alloy-based phase-change memory ($Ge_2Sb_2Te_5$). For example, as a crystal state changes, the memory element MR enters a resistance state according to the crystal state. Then, data is allocated according to the resistance state. The number of resistance states that the memory element MR takes may be two, four, sixteen, etc., and is not limited thereto. For example, in a case where the memory element MR takes two resistance states, a low resistance state of the memory element MR is referred to as a "set state", and a high resistance state thereof is referred to as a "reset state".

The selector SW of the present embodiment includes a semiconductor layer, a gate insulating film, and a gate electrode. When the selector SW is in an ON state, an inversion layer (channel layer) is formed in the semiconductor layer of the selector SW, and a current flows through the inversion layer. For example, a resistance value of the memory element MR in the lowest resistance state is 10 times (an order of magnitude) or more higher than a resistance value of the semiconductor layer of the selector SW in the ON state. Therefore, when the selector SW is in the ON state, a current flows through the selector SW, while no current flows through the memory cell MC connected to the drain of the selector SW, i.e., the memory element MR. Accordingly, no current flowing through the memory element MR means that the memory cell MC is not to be selected. Hereinafter, a memory cell MC that is not selected is also referred to as a "non-selected memory cell MC".

On the other hand, when the selector SW is in an OFF state, an inversion layer (channel layer) is not formed in the semiconductor layer of the selector SW, and a current does not flow through the semiconductor layer. A resistance value of the memory element MR in the highest resistance state is 10 times (an order of magnitude) or more lower than a resistance value of the semiconductor layer of the selector SW in the OFF state. Thus, a current flows through the memory cell MC, i.e., the memory element MR connected to the drain of the selector SW. A current flowing through the memory element MR means that the memory cell MC is to be selected. Hereinafter, a memory cell MC which is selected is also referred to as a "selected memory cell MC".

1.1.3 Overall Configuration of Memory Cell Array

Figure 3:
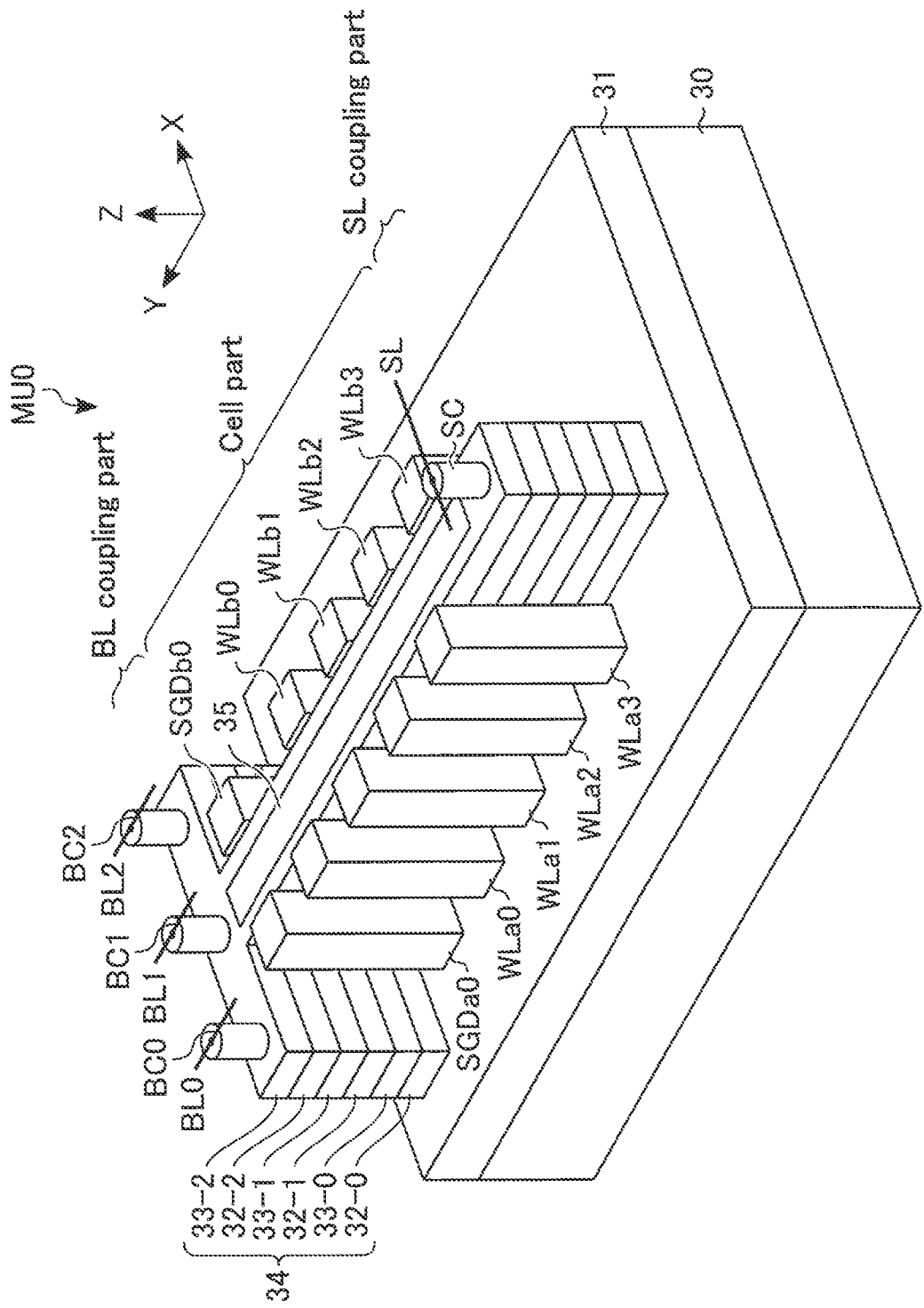
FIG. 3 is a perspective view of the memory cell array included in the memory device according to the first embodiment.

Next, an example of an overall configuration of the memory cell array 10 will be described with reference to FIG. 3. FIG. 3 shows a perspective view of the memory unit MU0. In the example of FIG. 3, some of the insulating layers are omitted. In the following descriptions, a direction approximately parallel to the semiconductor substrate will be referred to as an "X direction". A direction approximately parallel to the semiconductor substrate, intersecting the X direction, and in which the bit lines BL extend will be referred to as a "Y direction". Further, a direction approximately perpendicular to the semiconductor substrate will be referred to as a "Z direction".

As shown in FIG. 3, an insulating layer 31 is provided on a semiconductor substrate 30. The insulating layer 31 is, for example, a silicon oxide ($SiO_2$). The memory cell array 10 (the memory unit MU0 in the example of FIG. 3) is provided on the insulating layer 31. The memory unit MU0 includes, for example, a laminate 34, a variable resistance layer 35, word lines WLa0 to WLa3 and WLb0 to WLb3, select gate lines SGDa0 and SGDb0, contact plugs BC0 to BC2, a contact plug SC, bit lines BL0 to BL2, and a source line SL.

The laminate 34 includes three insulating layers 32 and three semiconductor layers 33 that are alternately stacked. Hereinafter, when distinguishing the three insulating layers 32, they will be referred to as insulating layers 32-0 to 32-3 in order from the bottom. When distinguishing the three semiconductor layers 33, they will be referred to as semiconductor layers 33-0 to 33-2 in order from the bottom. For the insulating layers 32, $SiO_2$ is used, for example. For the semiconductor layers 33, polysilicon doped with impurities (dopant) is used, for example.

The laminate 34 includes a BL coupling part extending in the X direction, a cell part having one end connected to the BL coupling part and extending in the Y direction, and an SL coupling part connected to the other end of the cell portion. One laminate 34 corresponds to one memory unit MU. In the example of FIG. 3, for simplification of the description, a case where one memory unit MU includes one cell part is shown, but for example, one memory unit MU may include a plurality of cell parts respectively corresponding to string units SU.

In the cell part, the variable resistance layer 35 is provided in the semiconductor layers 33. An example of a material of the variable resistance layer 35 is an alloy-based phase-change memory ($Ge_2Sb_2Te_5$). The variable resistance layer 35 may have a configuration including any one of (I) $Ge_2Sb_2Te_5$ as an alloy-based phase-change memory, (II) an alternate layer stack of GeTe and $Sb_2Te_3$ as interfacial phase-change memories, (III) an alternate layer stack of GeTe and BiSbTe as interfacial phase-change memories, (IV) an alternate layer stack of Ge, Sb, and Te, or a chalcogenide material, (V) TiOx, WOx, HfOx, TaOx, etc. as variable resistance layers, and (V) a CoFe alloy, a NiFe alloy, etc. as MTJ elements.

The semiconductor layer 33-0 and the variable resistance layer 35 provided in the semiconductor layer 33-0 in the cell part correspond to the memory string MS0. Similarly, the semiconductor layer 33-1 and the variable resistance layer 35 provided in the semiconductor layer 33-1 correspond to the memory string MS1. The semiconductor layer 33-2 and the variable resistance layer 35 provided in the semiconductor layer 33-2 correspond to the memory string MS2. The semiconductor layers 33 of the cell part function as an active area in which the inversion layers (channel layers) of the select transistors ST1 and the selectors SW are formed. In addition, the variable resistance layer 35 functions as an area in which the memory cells MC (memory elements MR) are formed.

The semiconductor layers 33 of the BL coupling part function as current paths for coupling the bit lines BL and the memory strings MS.

The BL coupling part is provided with the contact plugs BC0 to BC2 that electrically couple the semiconductor layers 33-0 to 33-2 and the bit lines BL0 to BL2 provided above the semiconductor layer 34 and extending in the Y direction, respectively. Each of the contact plugs BC0 to BC2 is electrically coupled to a corresponding one of the semiconductor layers 33-0 to 33-2, and is not electrically coupled to the other semiconductor layers 33.

The semiconductor layers 33 of the SL coupling part function as current paths for coupling the source line SL and the memory strings MS.

The SL coupling part is provided with a contact plug SC which electrically couples the semiconductor layers 33-0 to 33-2 and, for example, the source line SL provided above the laminate 34 and extending in the X direction. The contact plug SC is electrically coupled to the semiconductor layers 33-0 to 33-2.

The select gate lines SGD and word lines WL extending in the Z direction are provided so as to face side surfaces of the laminate 34 of the cell part facing the X direction. More specifically, the select gate line SGDa0 and the word lines WLa0 to WLa3 are provided in order in the Y direction from the bit line BL toward the source line SL so as to face one side surface of the laminate 34 facing the X direction. Then, the select gate line SGDb0 and the word lines WLb0 to WLb3 are provided in order in the Y direction from the bit line BL toward the source line SL so as to face the other side surface of the laminate 34 facing the X direction. Details of the layout of the select gate lines SGD and the word lines WL will be described later.

1.1.4 Planar Configuration of Memory Cell Array

Figure 4:
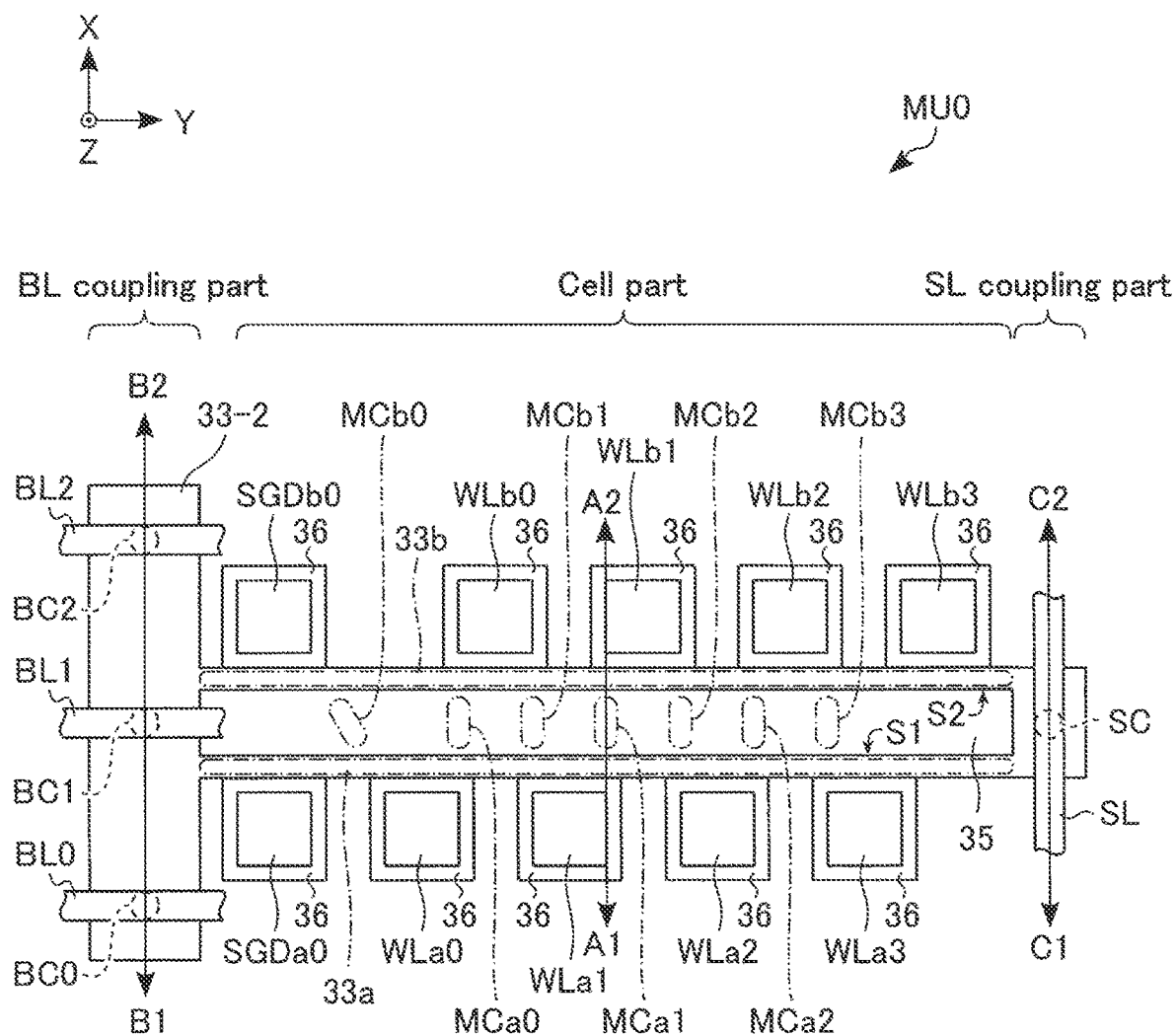
FIG. 4 is a plan view of the memory cell array included in the memory device according to the first embodiment.

Next, an example of a planar configuration of the memory cell array 10 will be described with reference to FIG. 4. FIG. 4 is a top view of the memory unit MU0. In the example of FIG. 4, some of the insulating layers are omitted.

As shown in FIG. 4, the semiconductor layer 33 includes a first portion 33a and a second portion 33b at the cell part. The first portion 33a extends in the V direction, one end of which is coupled to the BL coupling part, and the other end of which is coupled to the SL coupling part. Then, the first portion 33a is in contact with a side surface S1 of the variable resistance layer 35 facing the X direction. Similarly, the second portion 33b extends in the Y direction, one end of which is coupled to the BL coupling part, and the other end of which is coupled to the SL coupling part. Then, the second portion 33b is in contact with a side surface S2 of the variable resistance layer 35 facing the X direction.

Insulating layers 36 are provided so as to surround the side surfaces of the select gate lines SGD and the word lines WL. The insulating layers 36 function as gate insulating films of the select transistors ST1 or the selectors SW. For the insulating layers 36, $SiO_2$ is used, for example. The select gate line SGDa0 and the word lines WLa0 to WLa3 are arranged so that the corresponding insulating layers 36 are in contact with one side surface S1 of the laminate 34 (semiconductor layer 33a) facing the X direction. Similarly, the select gate line SGDb0 and the word lines WLb0 to WLb3 are arranged so that the corresponding insulating layers 36 are in contact with the other side surface S2 of the laminate 34 (semiconductor layer 33b) facing the X direction. The select gate line SGDa0 and the select gate line SGDb0 are arranged in line in the X direction with the laminate 34 interposed (sandwiched) therebetween. In other words, the select gate lines SGDa0 and SGDb0 face each other with the laminate 34 interposed therebetween. The word lines WLa0 to WLa3 and the word lines WLb0 to WLb3 are arranged so as to be in a two-row staggered arrangement toward the Y direction with the laminate 34 interposed (sandwiched) therebetween. More specifically, for example, the select gate line SGDa0 and the word lines WLa0 to WLa3 are arranged at approximately equal intervals along the Y direction. In this state, the word line WLb0 is arranged between the word lines WLa0 and WLa1 in the Y direction, and is arranged at a position different from the word lines WLa0 and WLa1 in the X direction. That is, the word line WLb0 is arranged so as to be adjacent to the word lines WLa0 and WLa1 with the laminate 34 interposed therebetween. Similarly, the word line WLb1 is arranged between the word lines WLa1 and WLa2 in the Y direction. The word line WLb2 is arranged between the word lines WLa2 and WLa3 in the Y direction. The word line WLb3 is arranged between the word line WLa3 and the SL coupling part (contact plug SC) in the Y direction. A distance between the select gate line SGDb0 and the word line WLb0 is longer than a distance between the word lines WLb aligned in the Y direction. Further, a distance between the select gate line SGDb0 and the word line WLb0 is longer than a distance between the select gate line SGDa0 and the word line WLa0. For example, the word lines WLb0 to WLb3 are arranged at approximately equal intervals along the Y direction.

An end portion of the word line WLa and an end portion of the word line WLb adjacent to each other with the laminate 34 interposed therebetween may be arranged so as to overlap each other in the Y direction, or may be arranged so as not to overlap each other (so as to be located away from each other). More specifically, an end portion of the word line WLa0 and an end portion of the word line WLb0 may be arranged so as to overlap each other in the Y direction, or may be arranged so as not to overlap each other. In the following descriptions, a case where the end portion of the word line WLa and the end portion of the word line WLb are arranged so as to overlap each other will be described.

In the present embodiment, each memory cell MC is structurally not separated. In the variable resistance layer 35, a region corresponding to the shortest path (shortest distance or shortest current path) connecting the select gate line SGDb0 and the word line WLa0 functions as the memory cell MCb0 (memory element MR). Similarly, in the variable resistance layer 35, a region corresponding to the shortest path connecting the word lines WLa0 and WLb0 functions as the memory cell MCa0. In the variable resistance layer 35, a region corresponding to the shortest path connecting the word lines WLb0 and WLa1 functions as the memory cell MCb1. In the variable resistance layer 35, a region corresponding to the shortest path connecting the word lines WLa1 and WLb1 functions as the memory cell MCa1. In the variable resistance layer 35, a region corresponding to the shortest path connecting the word lines WLb1 and WLa2 functions as the memory cell MCb2. In the variable resistance layer 35, a region corresponding to the shortest path connecting the word lines WLa2 and WLb2 functions as the memory cell MCa2. In the variable resistance layer 35, a region corresponding to the shortest path connecting the word lines WLb2 and WLa3 functions as the memory cell MCb3. Further, in the variable resistance layer 35, a region not corresponding to the memory cell MC (memory element MR) is set to a high resistance state (initial state).

1.1.5 Cross-Sectional Configuration of Memory Cell Array

Figure 5:
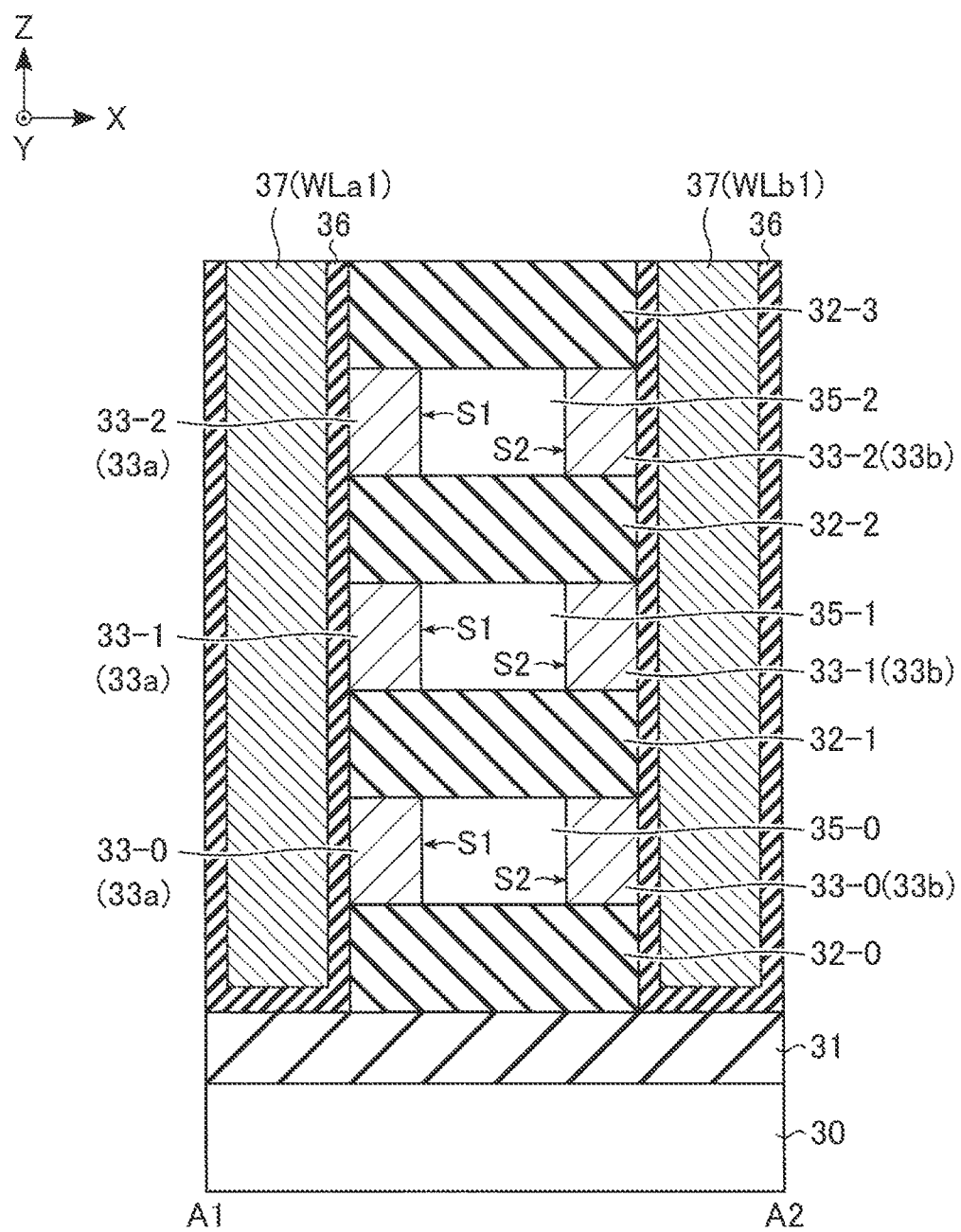
FIG. 5 is a cross-sectional view taken along line A1-A2 of FIG. 4.
Figure 6:
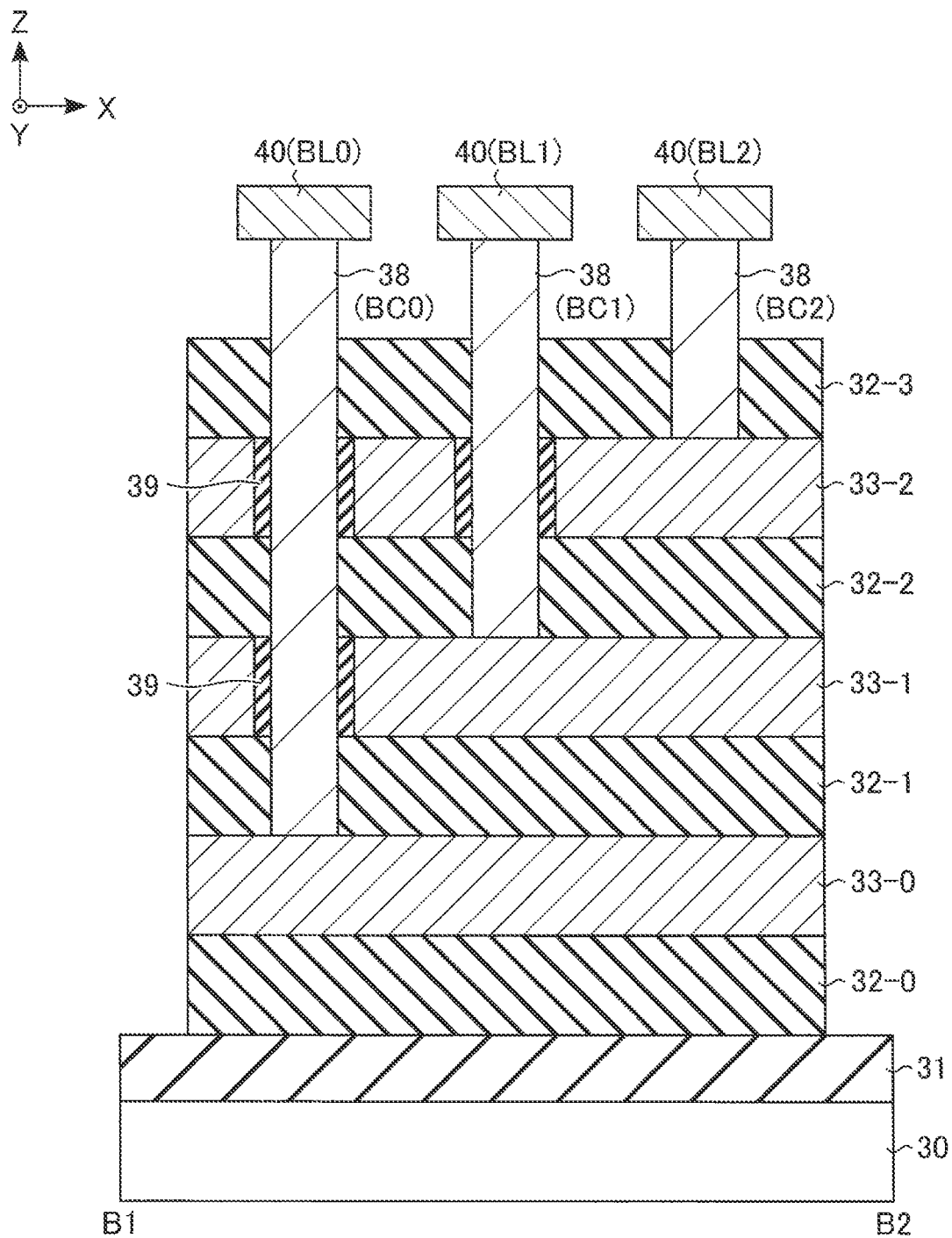
FIG. 6 is a cross-sectional view taken along line B1-B2 of FIG. 4.

Next, an example of a cross-sectional configuration of the memory cell array 10 will be described with reference to FIGS. 5 to 7. FIG. 5 is a cross-sectional view taken along line A1-A2 of FIG. 4. FIG. 6 is a cross-sectional view taken along line B1-B2 of FIG. 4. FIG. 7 is a cross-sectional view taken along line C1-C2 of FIG. 4.

First, a configuration of the cell part will be described.

As shown in FIG. 5, the insulating layer 31 is provided on the semiconductor substrate 30. Then, the insulating layer 32-0 is provided on the insulating layer 31. In addition, on the insulating layer 31, conductors 37 extending in the Z direction and having side and bottom surfaces covered by the insulating layers 36 are provided. The conductors 37 function as the select gate lines SGD or the word lines WL. In the example of FIG. 5, two conductors 37 function as the word lines WLa1 and WLb1, respectively. The conductors 37 are made of a conductive material; for example, an N-type semiconductor, a P-type semiconductor, or a metal material is used.

On the insulating layer 32-0, a variable resistance layer 35-0, and the semiconductor layer 33-0 in contact with side surfaces of the variable resistance layer 35-0 are provided. More specifically, the first portion 33a of the semiconductor layer 33-0 is in contact with a side surface S1 of the variable resistance layer 35-0 facing the X direction, and the second portion 33b of the semiconductor layer 33-0 is in contact with a side surface S2 of the variable resistance layer 35-0 facing the X direction. The variable resistance layer 35-0 and the semiconductor layer 33-0 function as the memory string MS0.

The insulating layer 32-1 is provided on the variable resistance layer 35-0 and the semiconductor layer 33-0. Then, a variable resistance layer 35-1 and the semiconductor layer 33-1 are provided on the insulating layer 32-1. More specifically, the first portion 33a of the semiconductor layer 33-1 is in contact with a side surface S1 of the variable resistance layer 35-1 facing the X direction, and the second portion 33b of the semiconductor layer 33-1 is in contact with a side surface S2 of the variable resistance layer 35-1 facing the X direction. The variable resistance layer 35-1 and the semiconductor layer 33-1 function as the memory string MS1.

The insulating layer 32-2 is provided on the variable resistance layer 35-1 and the semiconductor layer 33-1. Then, a variable resistance layer 35-2 and the semiconductor layer 33-2 are provided on the insulating layer 32-2. More specifically, the first portion 33a of the semiconductor layer 33-2 is in contact with a side surface S1 of the variable resistance layer 35-2 facing the X direction, and the second portion 33b of the semiconductor layer 33-2 is in contact with a side surface S2 of the variable resistance layer 35-2 facing the X direction. The variable resistance layer 35-2 and the semiconductor layer 33-2 function as the memory string MS2.

The insulating layer 32-3 is provided on the variable resistance layer 35-2 and the semiconductor layer 33-2.

Next, a configuration of the BL coupling part will be described.

As shown in FIG. 6, in the BL coupling part, each of the semiconductor layers 33 is coupled to a different bit line BL. More specifically, a contact plug BC0 penetrating the insulating layers 32-3 to 32-1 and semiconductor layers 33-2 and 33-1, and having a bottom surface which reaches the semiconductor layer 33-0 is formed. Insulating layers 39 are provided between the contact plug BC0 and the semiconductor layers 33-1 and 33-2. Accordingly, the contact plug BC0 is electrically coupled to the semiconductor layer 33-0, and is not electrically coupled to the semiconductor layers 33-1 and 33-2. The contact plug BC1 penetrates the insulating layers 32-3 and 32-2 and the semiconductor layer 33-2, and a bottom surface thereof reaches the semiconductor layer 33-1. The insulating layers 39 is provided between the contact plug BC1 and the semiconductor layer 33-2. The contact plug BC1 is electrically coupled to the semiconductor layer 33-1, and is not electrically coupled to the semiconductor layers 33-0 and 33-2. The contact plug BC2 penetrates the insulating layer 32-3, and a bottom surface thereof reaches the semiconductor layer 33-2. The contact plug BC2 is electrically coupled to the semiconductor layer 33-2, and is not electrically coupled to the semiconductor layers 33-0 and 33-1. The contact plugs BC0 to BC2 are filled with a conductor 38. Interconnect layers 40 which function as the bit lines BL0 to BL2, respectively, are provided on the contact plugs BC0 to BC2.

For the insulating layer 39, SiO₂ is used, for example. The conductor 38 and the interconnect layers 40 are made of a conductive material; for example, an N-type semiconductor, a P-type semiconductor, or a metal material is used.

Next, a configuration of the SL coupling part will be described.

As shown in FIG. 7, in the SL coupling part, the contact plug SC penetrating the insulating layers 32-3 to 32-1 and semiconductor layers 33-2 to 33-1, and having a bottom surface which reaches the semiconductor layer 33-0 is formed. The contact plug SC is filled with a conductor 41, and is electrically coupled to the semiconductor layers 33-0 to 33-2. An interconnect layer 42 which functions as the SL is formed on the conductor 41. The conductor 41 and the interconnect layer 42 are made of a conductive material; for example, an N-type semiconductor, a P-type semiconductor, or a metal material is used.

1.2 Selection Operation of Memory Cell

Figure 8:
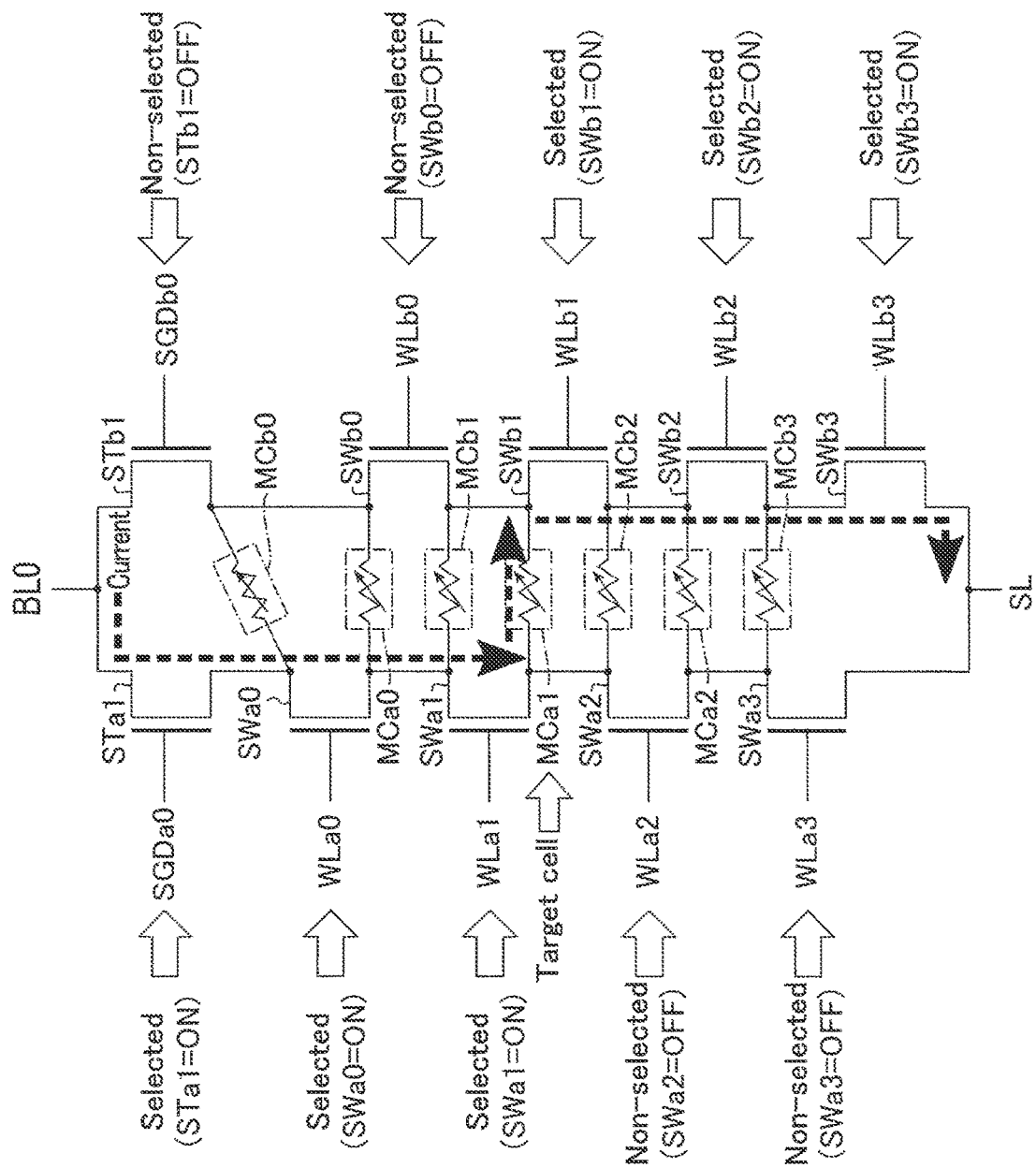
FIG. 8 is a circuit diagram of a memory string showing a selected state of a memory cell in the memory cell array included in the memory device according to the first embodiment.
Figure 9:
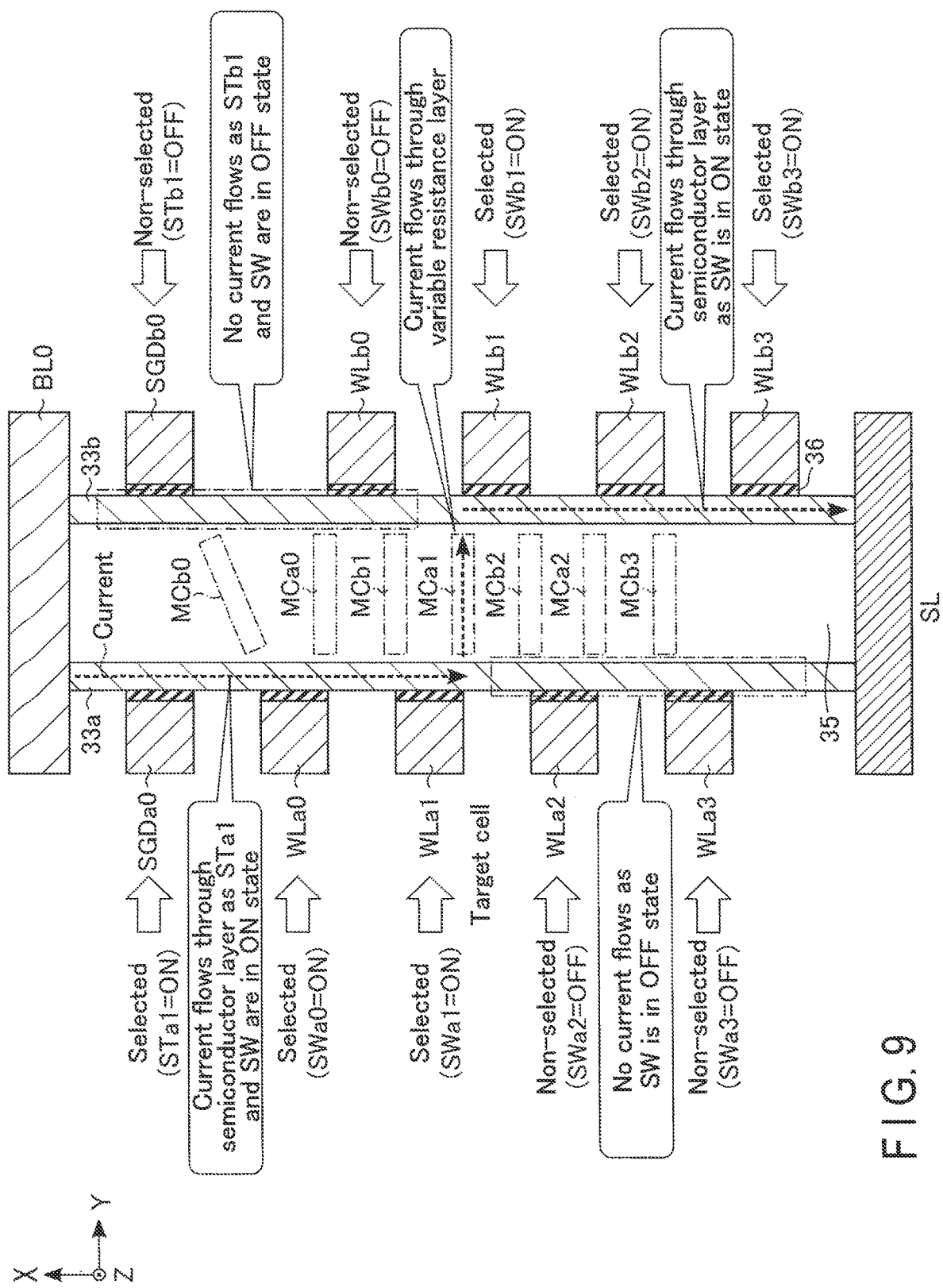
FIG. 9 is a conceptual diagram of the memory string showing the selected state of the memory cell in the memory cell array included in the memory device according to the first embodiment.
Figure 10:
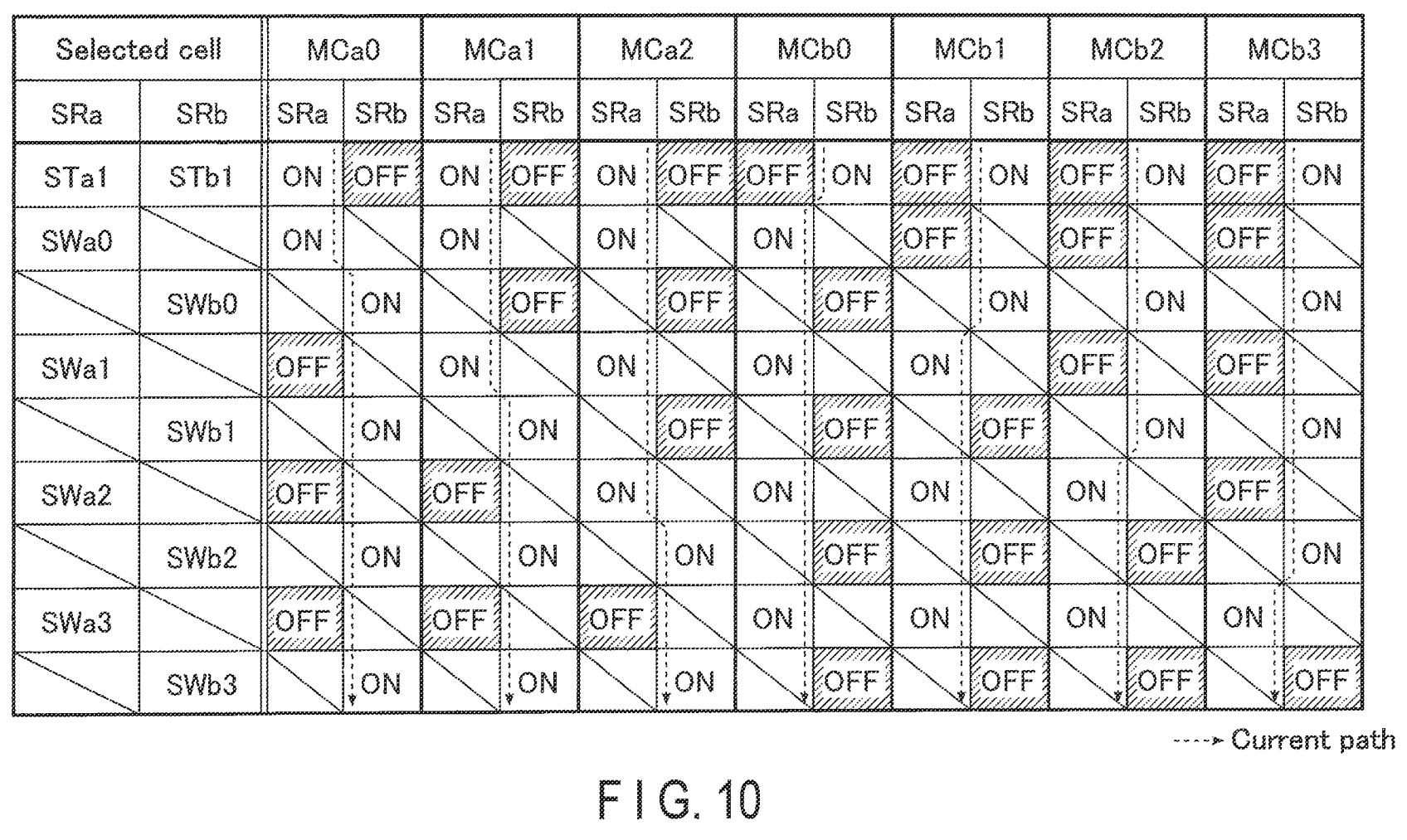

Next, a selection operation of the memory cell MC in the write operation and the read operation will be described with reference to FIGS. 8 to 10. FIG. 8 is a circuit diagram of the memory string MS0 showing a state in which the memory cell MCa1 is selected. FIG. 9 is a plan view of the semiconductor layer 33-0 showing the state in which the memory cell MCa1 is selected. FIG. 10 is a table showing states of the select transistors ST1 and the selectors SW corresponding to the selected memory cells MC.

In the present embodiment, the write and read operations are performed by passing a current between the bit line BL and the source line SL. Then, in the read and write operations, the memory cell MC can be selected by selecting a region (current path) through which the current flows in the variable resistance layer 35.

As shown in FIGS. 8 and 9, for example, when the memory cell MC to be selected is MCa1, a current flows from the string SRa to the string SRb. In this case, an ON voltage (positive voltage) for turning on the select transistor STa1 is applied to the select gate line SGDa0. Further, an OFF voltage (e.g., ground voltage VSS) for turning off the select transistor STb1 is applied to the select gate line SGDb0. The OFF voltage is a voltage lower than the ON voltage. Thereby, an inversion layer is formed in the first portion 33a of the semiconductor layer 33 of the select transistor STa1, entering a state (selected state) in which a current can flow. On the other hand, an inversion layer is not formed in the second portion 33b of the semiconductor layer 33 of the select transistor STb1, entering a state (non-selected state) in which a current cannot flow. In this state, in order to select the memory cell MCa1 (to pass a current through the memory cell MCa1), the selectors SWa0 and SWa1 are set to the selected state (ON state) and the selectors SWa2 and SWa3 are set to the non-selected state (OFF state) in the string SRa. Further, in the string SRb, the selector SWb0 is set to the non-selected state (OFF state), and the selectors SWb1 to SWb3 are set to the selected state (ON state). That is, an ON voltage for turning on the corresponding selectors SW is applied, to the word lines WLa0, WLa1, and WLb1 to WLb3, and an OFF voltage (e.g., ground voltage VSS) for turning off the corresponding selectors SW is applied to the word lines WLa2, WLa3, and WLb0.

The ON voltage of the select transistor ST1 and the ON voltage of the selector SW may be the same or different voltage values. Similarly, the OFF voltage of the select transistor ST1 and the OFF voltage of the selector SW may be the same or different voltage values. In the selector SW in the selected state, an inversion layer is formed in the semiconductor layer 33, entering a state (selected state) in which a current can flow. On the other hand, in the selector SW in the non-selected state, an inversion layer is not formed in the semiconductor layer 33, entering a state (non-selected state) in which a current cannot flow. As a result, the current flows from the bit line BL0 to the variable resistance layer 35 via the inversion layers (the first portion 33a of the semiconductor layer 33) of the select transistor STa1 and the selectors SWa0 and SWa1. Then, the current which has passed through the variable resistance layer 35 flows to the source line SL via the inversion layers (the second portion 33b of the semiconductor layer 33) of the selectors SWb1 to SWb3. In the variable resistance layer 35, a region (current path) through which the current flows functions as the memory cell MCa1.

Note that the memory device 1 of the present embodiment is a variable resistance-type memory, and has no erase operation.

Also, the write operation and the read operation are performed by passing a current between the bit line BL and the source line SL via the target, memory string MS. Thus, the memory string MS, which is not the target of the write operation or the read operation, can be unselected by setting the voltage of the source line SL and the voltage of the bit line BL to the same voltage value. Further, the write operation can be selected in units of select transistors ST1.

The sequencer 13 can control the sense amplifier module 16 so as to perform the write operation to a reset state or the write operation to a set state at the same time for each bit line BL.

Next, states (ON/OFF states) of the select transistors ST1 and selectors SW corresponding to a selected memory cell MC will be described.

As shown in FIG. 10, when the memory cell MCa0 is selected, in the string SRa, the select transistor STa1 and the selector SWa0 are turned on, and the selectors SWa1 to SWa3 are turned off. In the string SRb, the transistor STb1 is turned off, and the selectors SWb0 to SWb3 are turned on. In this state, a current flows through the select transistor STa1 and the selectors SWa0 and SWb0 to SWb3, in the ON state.

When the memory cell MCa1 is selected, in the string SRa, the select transistor STa1 and the selectors SWa0 and SWa1 are turned on, and the selectors SWa2 and SWa3 are turned off. In the string SRb, the select transistor STb1 and the selector SWb0 are turned off, and the selectors SWb1 to SWb3 are turned on. In this state, the current flows through the select transistor STa1, the selectors SWa0, SWa1, and SWb1 to SWb3, in the ON state.

When the memory cell MCa2 is selected, in the string SRa, the select transistor STa1 and the selectors SWa0 to SWa2 are turned on, and the selector SWa3 is turned off. In the string SRb, the select transistor STb1 and the selectors SWb0 and SWb1 are turned off, and the selectors SWb2 and SWb3 are turned on. In this state, the current flows through the select transistor STa1 and the selectors SWa0 to SWa2, SWb2, and SWb3, in the ON state.

When the memory cell MCb0 is selected, in the string SRa, the select transistor STa1 is turned off, and the selectors SWa0 to SWa3 are turned on. In the string SRb, the transistor STb1 is turned on, and the selectors SWb0 to SWb3 are turned off. In this state, the current flows through the select transistor STb1 and the selectors SWa0 to SWa3, in the ON state.

When the memory cell MCb1 is selected, in the string SRa, the select transistor STa1 and the selector SWa0 are turned off, and the selectors SWa1 to SWa3 are turned on. In the string SRb, the select transistor STb1 and the selector SWb0 are turned on, and the selectors SWb1 to SWb3 are turned off. In this state, the current flows through the select transistor STb1 and the selectors SWb0 and SWa1 to SWa3, in the ON state.

When the memory cell MCb2 is selected, in the string SRa, the select transistor STa1 and the selectors SWa0 and SWa1 are turned off, and the selectors SWa2 and SWa3 are turned on. In the string SRb, the select transistor STb1 and the selectors SWb0 and SWb1 are turned on, and the selectors SWb2 and SWb3 are turned off. In this state, the current flows through the select transistor STb1 and the selectors SWb0, SWb1, SWa2, and SWa3, in the ON state.

When the memory cell MCb3 is selected, in the string SRa, the select transistor STa1 and the selectors SWa0 to SWa2 are turned off, and the selector SWa3 is turned on. In the string SRb, the select transistor STb1 and the selectors SWb0 to SWb2 are turned on, and the selector SWb3 is turned off. In this state, the current flows through the select transistor STb1 and the selectors SWb0 to SWb2 and SWa3, in the ON state.

1.3 Voltages of Interconnects in Write Operation and Read Operation

Figure 11:
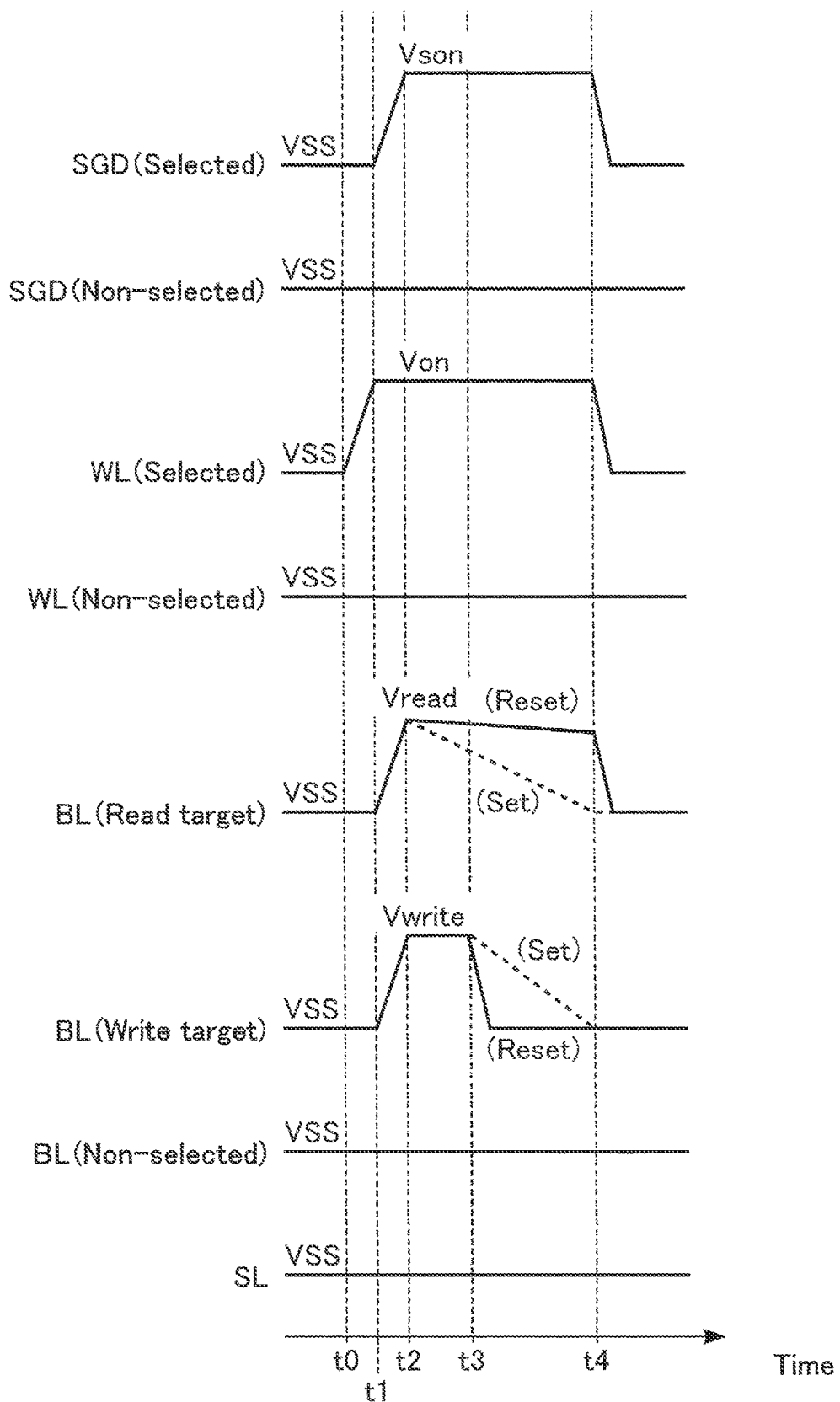
FIG. 11 is a timing chart showing voltages of interconnects during a write operation and a read operation in the memory device according to the first embodiment.

Next, an example of voltages of the interconnects in the write operation and the read operation will be described with reference to FIG. 11. FIG. 11 is a timing chart of an operation waveform.

First, the read operation will be described.

As shown in FIG. 11, at time t0, the sequencer 13 maintains voltages of the select gate lines SGD, the bit lines BL, and the source line SL, for example, at a voltage VSS. In this state, the sequencer 13 applies an ON voltage Von to a word line WL (hereinafter, referred to as a "selected word line WL") corresponding to a selector SW to be set to an ON state (selected state), and a voltage of a word line WL (hereinafter, referred to as a "non-selected word line WL") corresponding to a selector SW to be set to an OFF state (non-selected state) is maintained at the voltage VSS as an OFF voltage. The voltage Von is a voltage for turning on the selector SW (an inversion layer can be formed in the semiconductor layer 33), and is a voltage higher than the voltage VSS. As a result, the selector SW in the selected state is turned on, and the selector SW in the non-selected state is maintained in the OFF state.

At time t1, the sequencer 13 applies a voltage Vread to a bit line BL to be read. Further, the sequencer 13 applies a voltage Vson to a select gate line SGD corresponding to a select transistor ST1 to be set to a selected state. The voltage Vread is a voltage higher than the voltage VSS. The voltage Vson is a voltage which turns on the select transistor ST1 (which allows an inversion layer to be formed in the semiconductor layer 33), and is a voltage higher than the voltage VSS. The voltages Von and Vson may have the same or different voltage values.

At time t2, the sequencer 13 electrically decouples the sense amplifier module 16 and the bit line BL after the voltage of the bit line BL to be read reaches to the voltage Vread. Thereby, the voltage of the bit line BL gradually attenuates (the voltage is approximately maintained until time t4) when the memory element MR of the selected memory cell MC is in a high resistance state (reset), and the voltage of the bit line BL rapidly attenuates when the selected memory cell MC is in a low resistance state (set). As a sense operation, the sense amplifier module 16 compares the voltage of the bit line BL with a reference potential, for example, after a certain period of time has elapsed from t2 (e.g., at time t4), and senses whether the target memory element MR (memory cell MC) is in a low resistance state (set state) or a high resistance state (reset state). The reference potential is set, for example, to have a relationship of Vread≥bit line voltage (reset)>reference potential>bit line voltage (set).

At time t4, the sequencer 13 applies the voltage VSS to the select gate line SGD, the word line WL, the bit line BL, and the source line SL, and ends the read operation.

Next, the write operation will be described. Operation waveforms of the select gate lines SGD, word lines WL, and source line SL are the same for the read operation and the write operation. In contrast, operation waveforms of the bit lines BL are different between the read operation and the write operation. Hereinafter, points different from the read operation, i.e., the voltages of the bit lines BL, will be mainly described.

In the case of the write operation, the sequencer 13 applies a voltage Vwrite to a bit line BL to be written in a period from time t2 to time t3. The voltage Vwrite is a pulse voltage for writing, and is a voltage higher than the voltage VSS. For example, the voltage Vwrite is a voltage higher than the voltage Vread.

For example, in the period from time t3 to time t4, when the voltage of the bit line BL is rapidly lowered from Vwrite to the voltage VSS, the memory element MR is put into a high resistance reset state. Further, when the voltage of the bit line BL is lowered relatively slowly from Vwrite to the voltage VSS in the period from time t3 to time t4, the memory element MR is put into a low resistance set state. In the period from time t2 to time t4, i.e., the writing period, it is preferable to keep the voltage of the non-selected bit line BL equal to the voltage of the source line SL (e.g., at the voltage VSS). A memory cell MC is selected by application of a voltage to a bit line BL. If a potential of a non-selected bit line BL is increased, the selection would be erroneous, resulting in erroneous writing. In the present embodiment, a voltage is selectively applied to a bit line BL to be read or written.

1.4 Advantageous Effect of Present Embodiment

With the configuration according to the present embodiment, the word lines WL can be arranged on the two opposite side surfaces of the semiconductor layer 33 provided with the variable resistance layer 35 inside, and each of the word lines WL can be independently controlled. Thus, the memory cells MC (memory elements MR) can be provided corresponding to a current path through which a current passes in the variable resistance layer 35. Further, the cell density can be improved by arranging the word lines WL in a two-row staggered arrangement with the semiconductor layer 33 and the variable resistance layer 35 interposed (sandwiched) therebetween. This allows for high integration of the memory device.

2. Second Embodiment

Next, a second embodiment will be described. In the second embodiment, a cross-sectional configuration of the memory cell array 10 different from that of the first embodiment will be described. Hereinafter, points different from the first embodiment will be mainly described.

2.1 Cross-Sectional Configuration of Memory Cell Array

Figure 12:
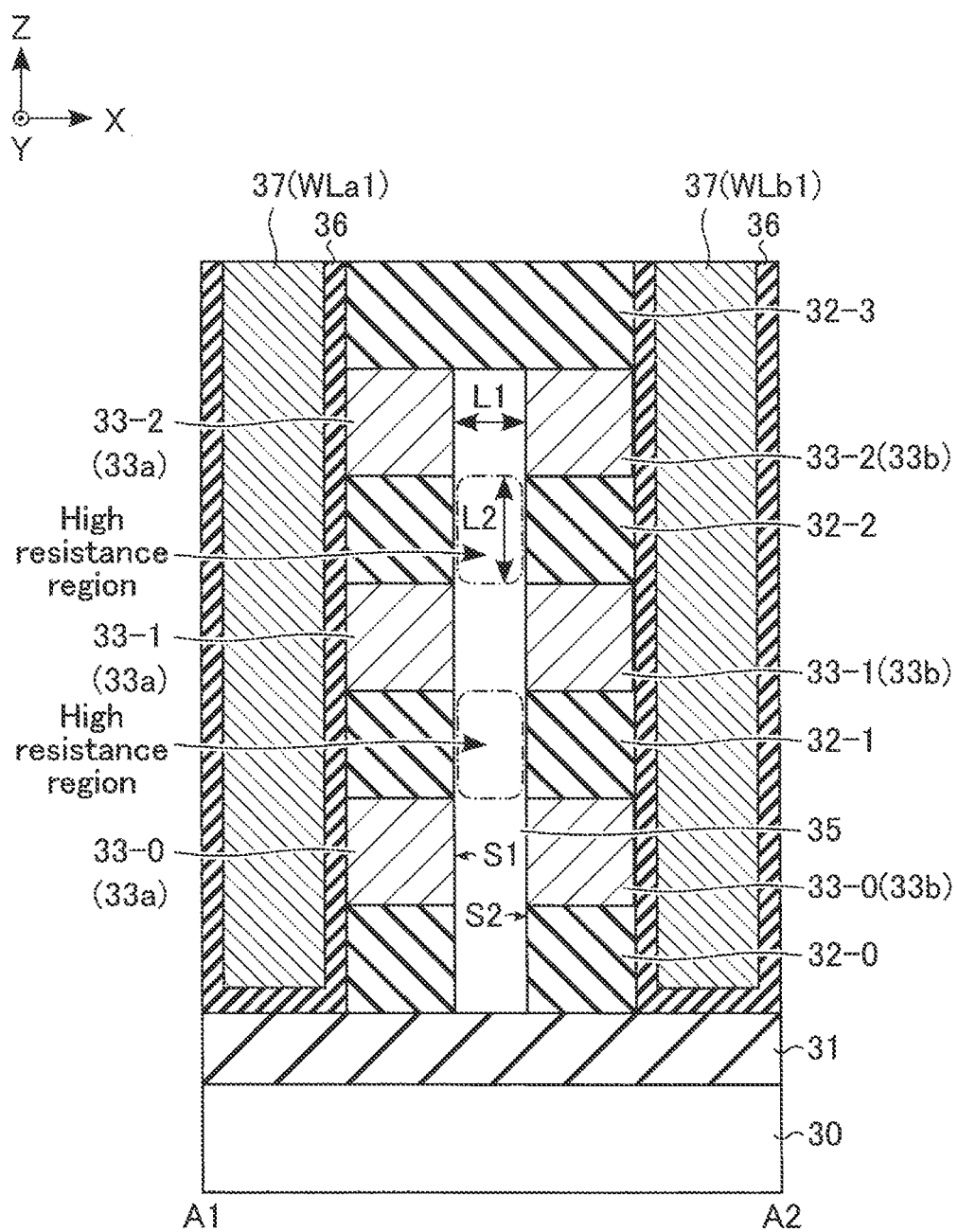
FIG. 12 is a cross-sectional view of a memory cell array included in a memory device according to a second embodiment.

A cross-sectional configuration of the memory cell array 10 will be described with reference to FIG. 12. FIG. 12 is a cross-sectional view taken along line A1-A2 of FIG. 4.

As shown in FIG. 12, in the present embodiment, a trench penetrating (passing through) the insulating layers 32-0 to 32-2 and the semiconductor layers 33-0 to 33-2, for example, having a bottom surface which reaches the insulating layer 31, and extending in the Y direction is provided, and the variable resistance layer 35 is formed inside the trench. That is, one variable resistance layer 35 that is common to the semiconductor layers 33-0 to 33-2 is provided.

In this case, the region of the variable resistance layer 35 provided between the semiconductor layers 33 (at the same layer as the insulating layer 32) is set as a high, resistance region (i.e., a reset state), suppressing a leakage current from flowing between the semiconductor layers 33 stacked in the Z direction. A length of the variable resistance layer 35 in the X direction is L1, and a thickness of the high resistance region between the semiconductor layers 33 stacked in the Z direction is L2. For example, even when the memory cell MC is in a high resistance state, a relationship of L1<L2 is set in order to suppress the current from flowing in the high resistance region between the semiconductor layers 33.

2.2 Advantageous Effect of Present Embodiment

With the configuration according to the present, embodiment, the same advantageous effect as that of the first embodiment can be obtained.

3. Third Embodiment

Next, a third embodiment will be described. In the third embodiment, descriptions will be given of two examples of the layout of select gate lines SGD and word lines WL, which are different from that in the first embodiment. Hereinafter, points different from the first and second embodiments will be mainly described.

3.1 First Example

Figure 13:
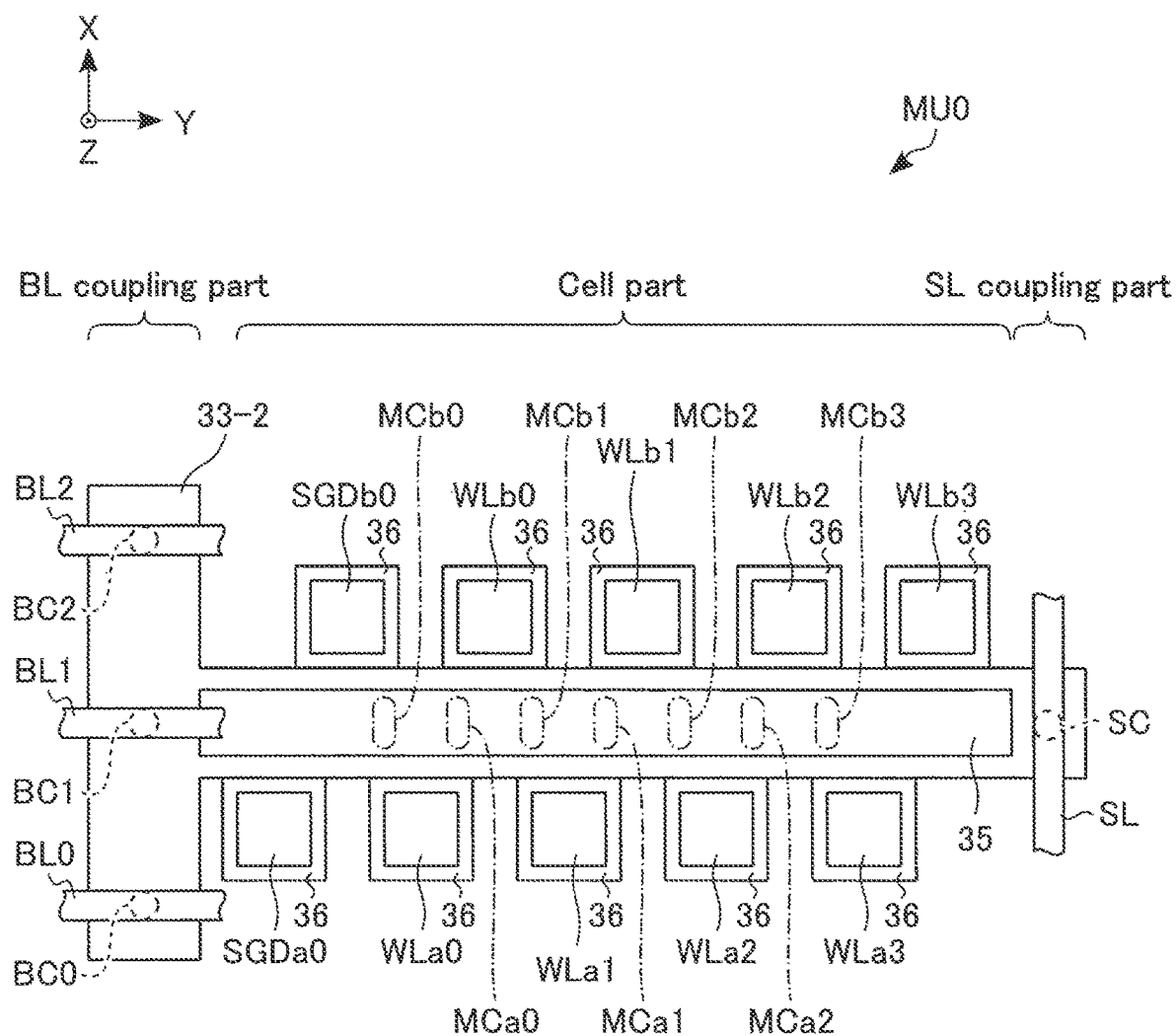
FIG. 13 is a plan view of a memory cell array included in a memory device according to a first example of a third embodiment.

First, a first example will be described. In the first example, a case where the arrangement of the select gate line SGDb0 is different from that in the first embodiment will be described with reference to FIG. 13. FIG. 13 is a top view of the memory unit MU0. In the example of FIG. 13, some of the insulating layers are omitted.

As shown in FIG. 13, in this example, the select gate line SGDa0 and the word lines WLa0 to WLa3, and the select gate line SGDb0 and the word lines WLb0 to WLb3 are arranged in a two-row staggered arrangement toward the Y direction with the laminate 34 interposed (sandwiched) therebetween. More specifically, for example, the select gate line SGDa0 and the word lines WLa0 to WLa3 are arranged at approximately equal intervals along the Y direction. Similarly, for example, the select, gate line SGDb0 and the word lines WLb0 to WLb3 are arranged at approximately equal intervals along the Y direction. That is, unlike the first embodiment, the select gate line SGDb0 is arranged between the select gate line SGDa0 and the word line WLa0 in the Y direction. In other words, the select gate line SGDb0 is arranged so as to be adjacent to the select gate line SGDa0 and the word line WLa0 with the laminate 34 interposed (sandwiched) therebetween.

In this example, in the variable resistance layer 35, a length of the shortest path connecting the select gate line SGDb0 and the word line WLa0 can be made the same as a length of the shortest path connecting the word lines WLa and WLb. In other words, in the variable resistance layer 35, a size (resistance value) of a region corresponding to the memory cell MCb0 can be made the same as a size (resistance value) of a region corresponding to each of the other memory cells MC.

3.2 Second Example

Figure 14:
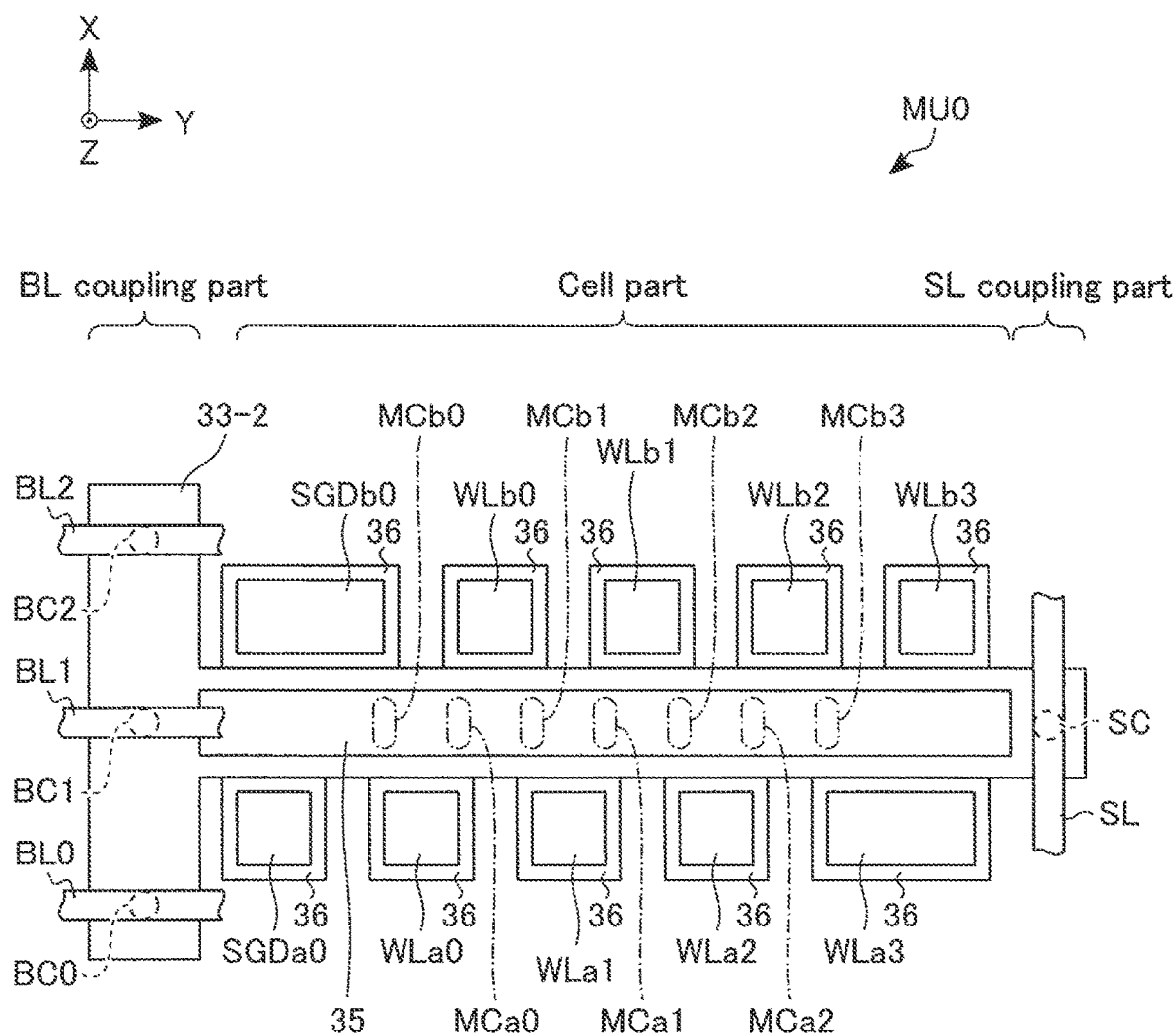
FIG. 14 is a plan view of a memory cell array included in a memory device according to a second example of the third embodiment.

Next, a second example, will be described. In the second example, a description will be given of a case where the select gate line SGDb0 and the word line WLa3 are different from those in the first embodiment with reference to FIG. 14. FIG. 14 is a top view of the memory unit MU0. In the example of FIG. 14, some of the insulating layers are omitted.

As shown in FIG. 14, in this example, the shapes of the select gate line SGDb0 and the word line WLa3 are different from those of the select gate line SGDa0 and the other word lines WL. More specifically, the select gate line SGDb0 of this example extends toward the word line WLb0 side (Y direction) as compared with the select gate line SGDb0 described in the first embodiment so that a distance between the select gate line SGDb0 and the word line WLb0 is, for example, approximately equal to a distance between the word lines WLb0 and WLb1. Accordingly, a length of the select gate line SGDb0 in the Y direction is longer than that of the select gate line SGDa0 in the Y direction. At this time, a distance between the BL coupling part and the select gate line SGDb0 is approximately equal to a distance between the BL coupling part and the select gate line SGDa0.

Further, the word line WLa3 of this example extends toward the SL coupling part side as compared with the word line WLa3 described in the first embodiment so that a distance between the word line WLa3 and the SL coupling part is approximately equal to a distance between the word line WLb3 and the SL coupling part. Accordingly, a length of the word line WLa3 in the Y direction is longer than that of the word line WLb3 in the Y direction.

In this example, as in the first example, in the variable resistance layer 35, the size (resistance value) of the region corresponding to the memory cell MCb0 can be made the same as the size (resistance value) of the region corresponding to each of the other memory cells MC. Further, a distance between the bit line BL and an inversion layer formed in the select transistor STb1 can be made approximately the same as a distance between the bit line BL and an inversion layer formed in the select transistor STa1. Furthermore, a distance between the source line SL and an inversion layer formed in the selector SWa3 can be made approximately the same as a distance between the source line SL and an inversion layer formed in the selector SWb3.

As a result, it is possible to suppress variations in a resistance value of a current, path of the semiconductor layer 33 when the select transistor STa1 is selected and a resistance value, of a current path of the semiconductor layer 33 when the select transistor STb1 is selected.

3.3 Advantageous Effect of Present Embodiment

With the configuration of the present embodiment, the same advantageous effect as that of the first embodiment can be obtained.

Further, with the configuration according to the present embodiment, sizes (resistance values) of regions corresponding to the memory cells MC can be made approximately equal in the variable resistance layer 35. Accordingly, it is possible to reduce variations in the resistance values of the memory cells MC in the set state and the reset state. Therefore, it is possible to suppress erroneous operations in the write and read operations, and to improve reliability of the memory device.

Further, with the configuration according to the second example of the present embodiment, it is possible to suppress variations in a resistance value of a current path of the semiconductor layer 33 when the select transistor STa1 is selected and a resistance value of a current path of the semiconductor layer 33 when the select transistor STb1 is selected. As a result, it is possible to suppress variations in the current values between the case where the select transistor STa1 is selected and the case where the select transistor STb1 is selected. Therefore, it is possible to suppress erroneous operations in the write and read operations, and improve reliability of the memory device.

The present embodiment can be combined with the second embodiment to the extent possible.

4. Fourth Embodiment

Next, a fourth embodiment will be described. In the fourth embodiment, a description will be given of a case where a superlattice layer as an interfacial phase-change memory (iPCM) is used for the variable resistance layer 35. Hereinafter, points different from the first to third embodiments will be mainly described.

4.1 Planar Configuration of Memory Cell Array

Figure 15:
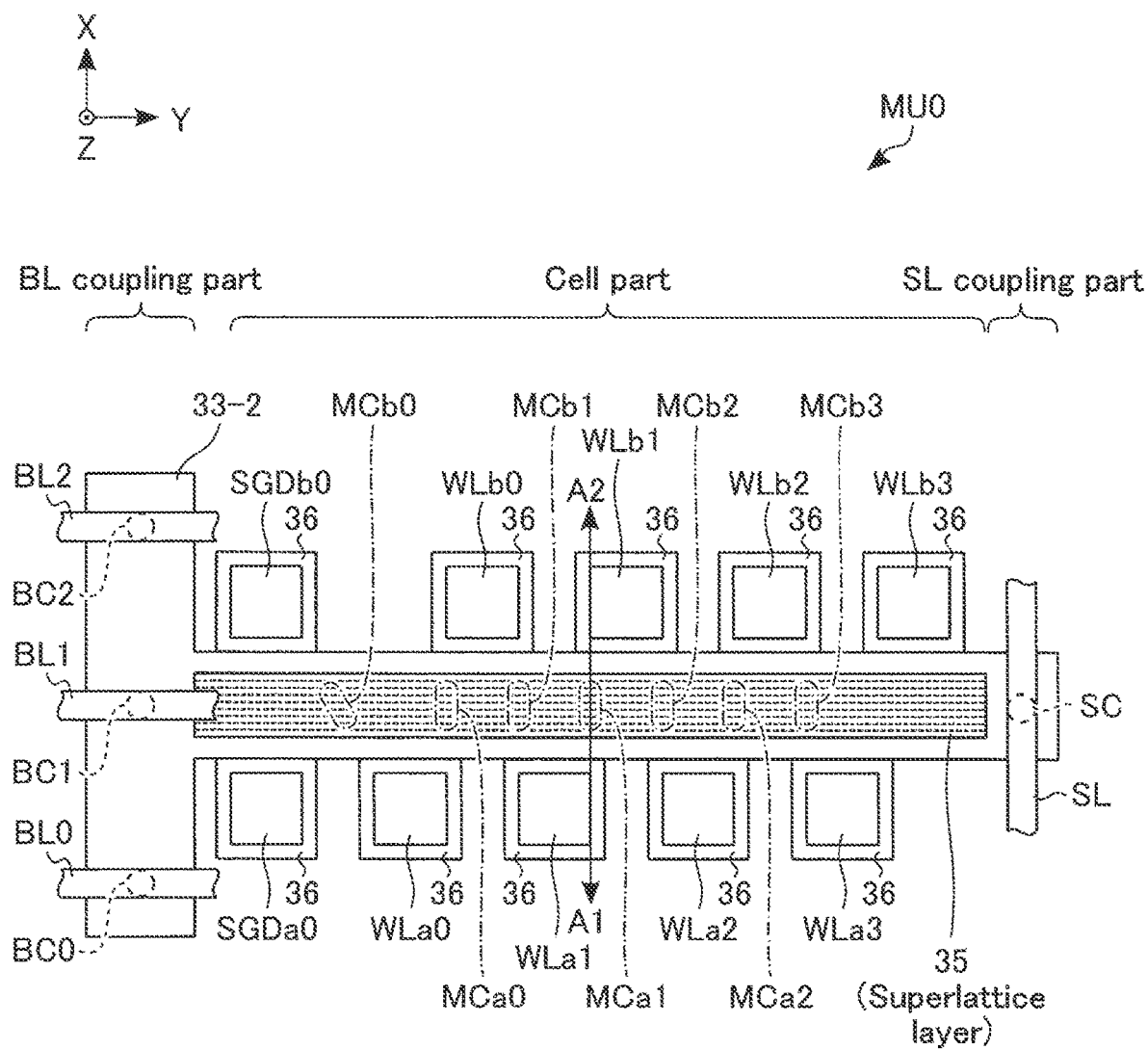
FIG. 15 is a plan view of a memory cell array included in a memory device according to a fourth embodiment.

Next, an example of a planar configuration of the memory cell array 10 will be described with reference to FIG. 15. FIG. 15 is a top view of the memory unit MU0. In the example of FIG. 15, some of the insulating layers are omitted.

As shown in FIG. 15, for the variable resistance layer 35, a superlattice layer is formed so as to have a layer stack configuration toward the X direction. The variable resistance layer 35 may have, for example, a configuration in which $Sb_2Te_3$ and GeTe are alternately stacked as a superlattice layer, or BiSbTe and GeTe are alternately stacked as a superlattice layer.

4.2 Cross-Sectional Configuration of Memory Cell Array

Figure 16:
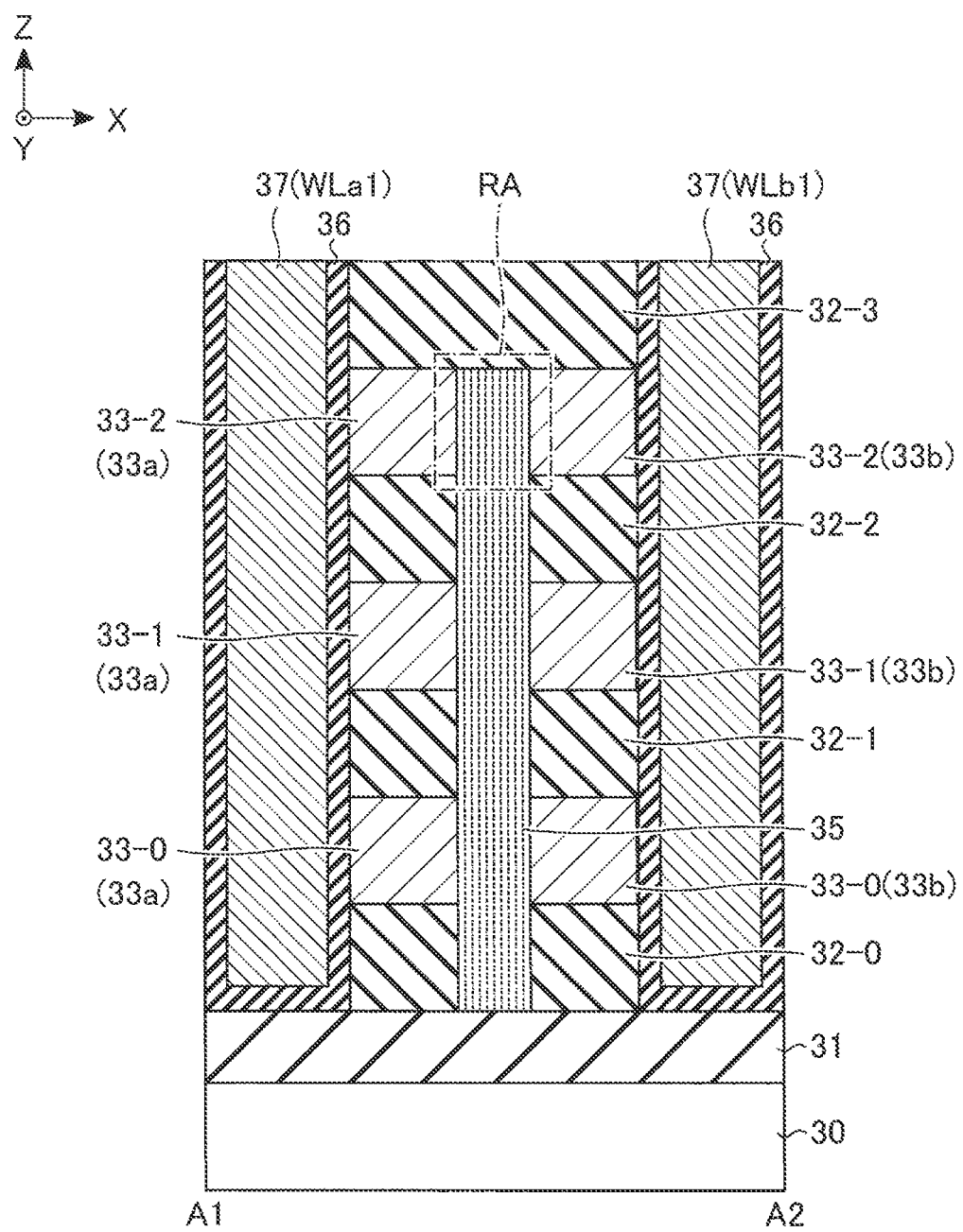
FIG. 16 is a cross-sectional view of the memory cell array included in the memory device according to the fourth embodiment.
Figure 17:
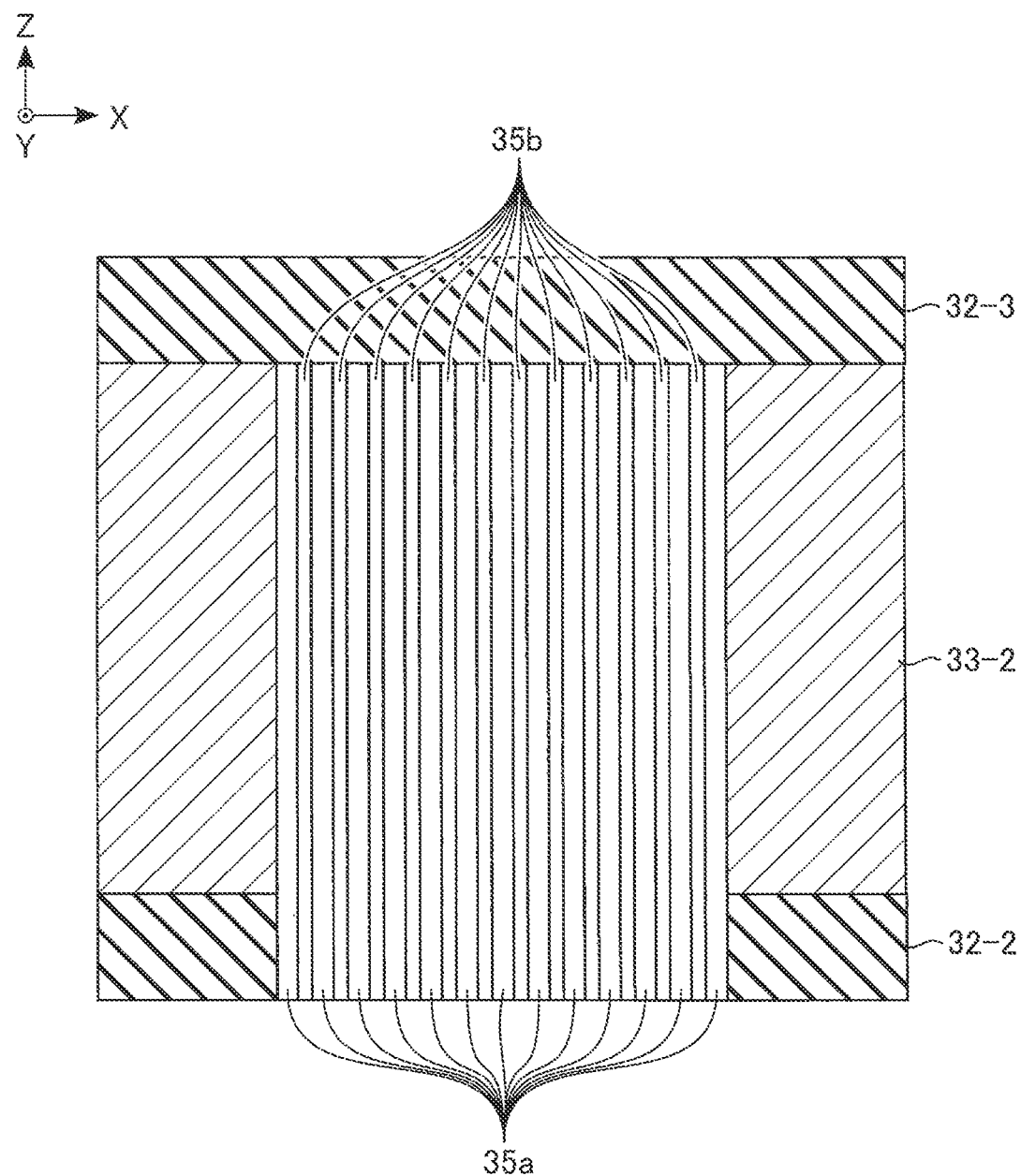
FIG. 17 is an enlarged view of a region RA shown in FIG. 16.

Next, an example of a cross-sectional configuration of the memory cell array 10 will be described with reference to FIGS. 16 and 17. FIG. 16 is a cross-sectional view taken along line A1-A2 of FIG. 15. FIG. 17 is an enlarged view of a region RA shown in FIG. 16. In the examples of FIGS. 16 and 17, a case where a superlattice layer is applied to the structure of the variable resistance layer 35 described in the second embodiment is shown.

As shown in FIGS. 16 and 17, for example, when the variable resistance layer 35 has a configuration in which $Sb_2Te_3$ (35a) and GeTe (35b) are alternately stacked as the superlattice layer, $Sb_2Te_3$ (35a) and GeTe (35b) each have a plate shape extending in the YS direction, and these are alternately stacked in the X direction.

In such a configuration, with respect to a selected memory cell MC, a current flows in a direction perpendicular to a film surface of the variable resistance layer 35, i.e., a stacking direction (X direction).

4.3 Advantageous Effect of Present Embodiment

With the configuration according to the present embodiment, the same advantageous effect as that of the first embodiment can be obtained.

The present embodiment can be combined with the first and third embodiments to the extent possible. For example, the super lattice layer may be applied to the cross-sectional structure of the variable resistance layers described in FIG. 5 of the first embodiment.

5. Fifth Embodiment

Next, a fifth embodiment will be described. In the fifth embodiment, a structure of a semiconductor layer different from those of the first to fourth embodiments will be described Hereinafter, points different from the first to fourth embodiments will be mainly described.

5.1 Planar Configuration of Memory Cell Array

Figure 18:
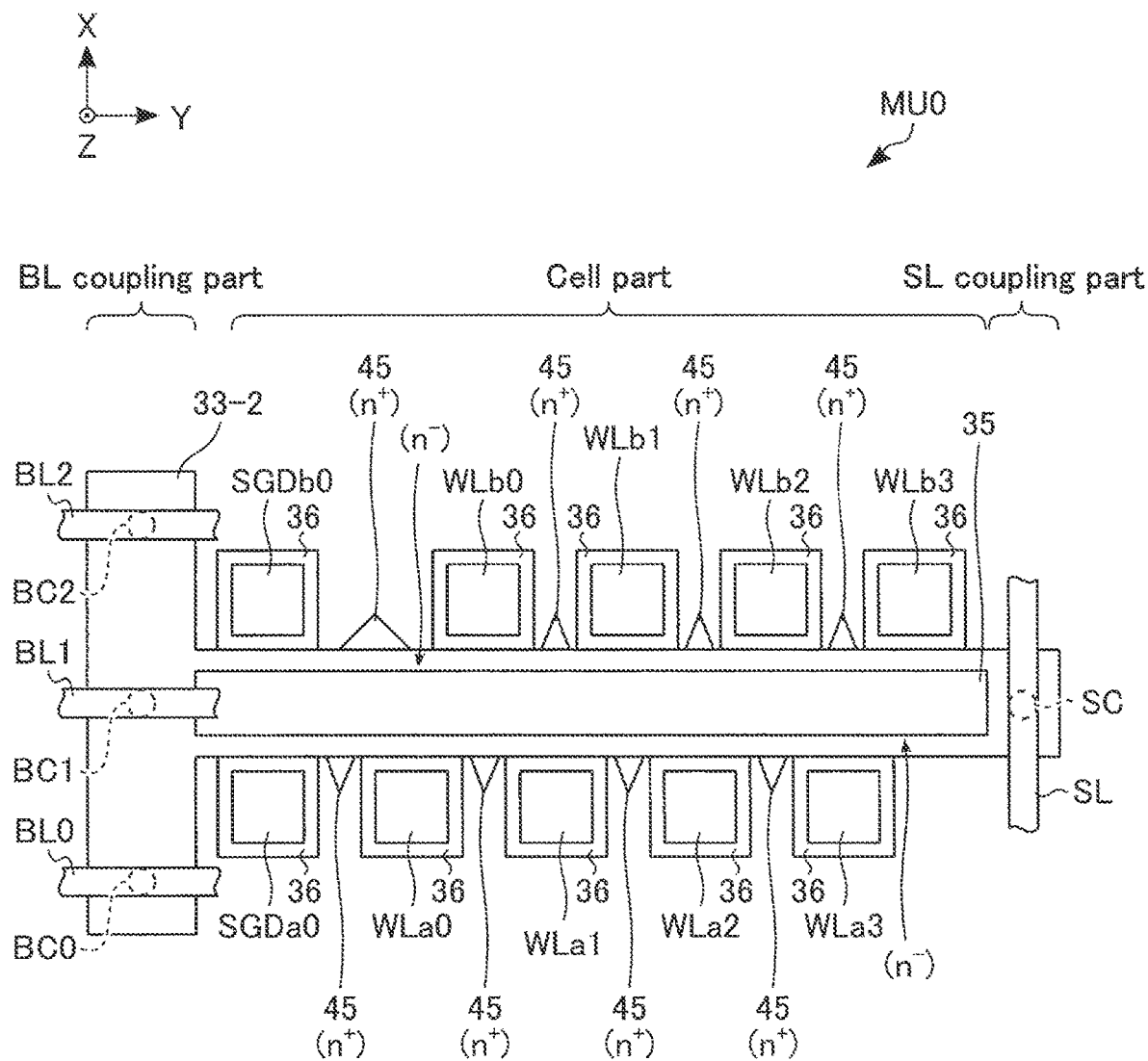
FIG. 18 is a plan view of a memory cell array included in a memory device according to a fifth embodiment.

A planar configuration of the memory cell array 10 will be described with reference to FIG. 18. FIG. 18 is a top view of the memory unit MU0. In the example of FIG. 18, some of the insulating layers are omitted.

As shown in FIG. 18, in the present embodiment, for the semiconductor layer 33, for example, an N-type semiconductor (n$^+$ diffusion layer) doped with phosphorus (P), etc. as a dopant at a relatively low concentration is used. Semiconductor layers 45, which are partially in contact with the semiconductor layer 33, are provided between the interconnects of the select gate line SGD and the word lines WL aligned along the Y direction. For the semiconductor layer 45, for example, an N-type semiconductor (n$^+$ diffusion layer) doped with phosphorus at a higher concentration than that of the semiconductor layer 33 is used. As a result, when an inversion layer is formed in the semiconductor layer 33, electric charges can be supplied from the semiconductor layer 45 to the semiconductor layer 33.

5.2 Advantageous Effect of Present Embodiment

With the configuration according to the present embodiment, the same advantageous effect as that of the first embodiment can be obtained.

The present embodiment can be combined with the second to fourth embodiments to the extent possible.

6. Sixth Embodiment

Next, a sixth embodiment will be described. In the sixth embodiment, a structure of a memory unit MU different from those, of the first to fifth embodiments will be described. Hereinafter, points different from the first to fifth embodiments will be mainly described.

6.1 Circuit Configuration of Memory Cell Array

First, an example of a circuit configuration of the memory cell array 10 will be described with reference to FIG. 19. FIG. 19 shows a circuit configuration of the memory unit MU0. The other memory units MU also have the same configuration.

As shown in FIG. 19, in the present embodiment, memory strings MS within a string unit SU are respectively associated with different source lines SL. More specifically, one ends of the memory strings MS0 to MS2 are coupled to different source lines SL0 to SL2, respectively. The plurality of source lines SL are controlled independently from one another.

6.2 Overall Configuration of Memory Cell Array

Figure 20:
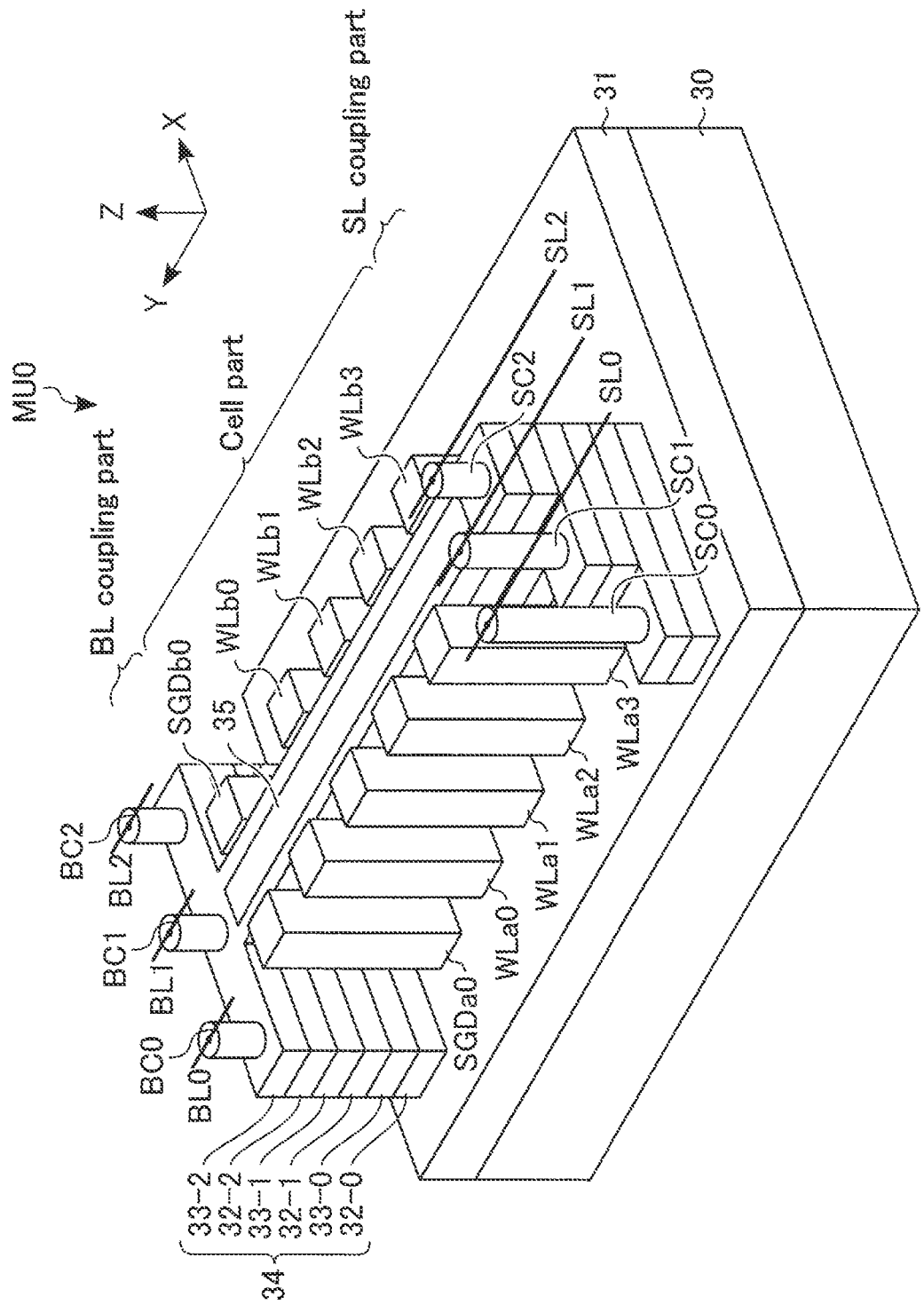
FIG. 20 is a perspective view of the memory cell array included in the memory device according to the sixth embodiment.

Next, an example of an overall configuration of the memory cell array 10 will be described with reference to FIG. 20. FIG. 20 shows a perspective view of the memory unit MU0. In the example of FIG. 20, some of the insulating layers are omitted.

As shown in FIG. 20, the memory unit MU0 of the present embodiment includes, for example, a laminate 34, a variable resistance layer 35, word lines WLa0 to WLa3 and WLb0 to WLb3, select gate lines SGDa0 and SGDb0, contact plugs BC0 to BC2, contact plugs SC0 to SC2, bit lines BL0 to BL2, and source lines SL0 to SL2.

In the SL coupling part, the contact plugs SC0 to SC2 which electrically couple the semiconductor layers 33-0 to 33-2 and the source lines SL0 to SL2 provided above the laminate 34 and, for example, extending in the Y direction, respectively, are provided. More specifically, in the SL coupling part, one ends of the semiconductor layers 33-0 to 33-2 extending in the X direction are drawn out in a staircase shape. Then, the contact plugs SC0 to SC2 are provided on the semiconductor layers 33-0 to 33-2 drawn out in a staircase shape, respectively.

6.3 Planar Configuration of Memory Cell Array

Figure 21:
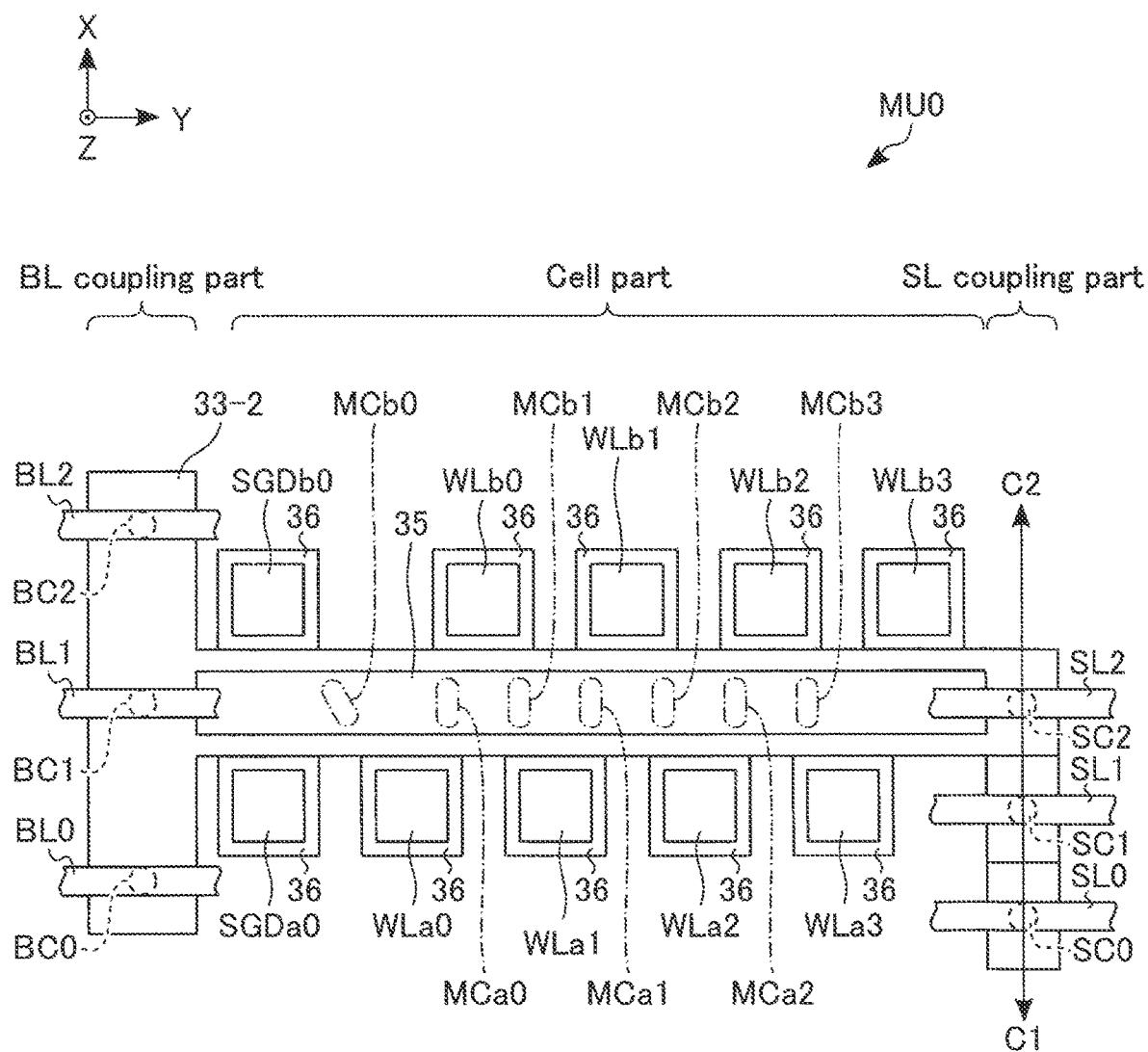
FIG. 21 is a plan view of the memory cell array included in the memory device according to the sixth embodiment.

Next, an example of a planar configuration of the memory cell array 10 will be described with reference to FIG. 21. FIG. 21 is a top view of the memory unit MU0. In the example of FIG. 21, some of the insulating layers are omitted.

As shown in FIG. 21, in the SL coupling part of the laminate 34, the contact plugs SC0 to SC2 coupled to the source lines SL0 to SL2, respectively, are provided.

6.4 Cross-Sectional Configuration of Memory Cell Array

Figure 22:
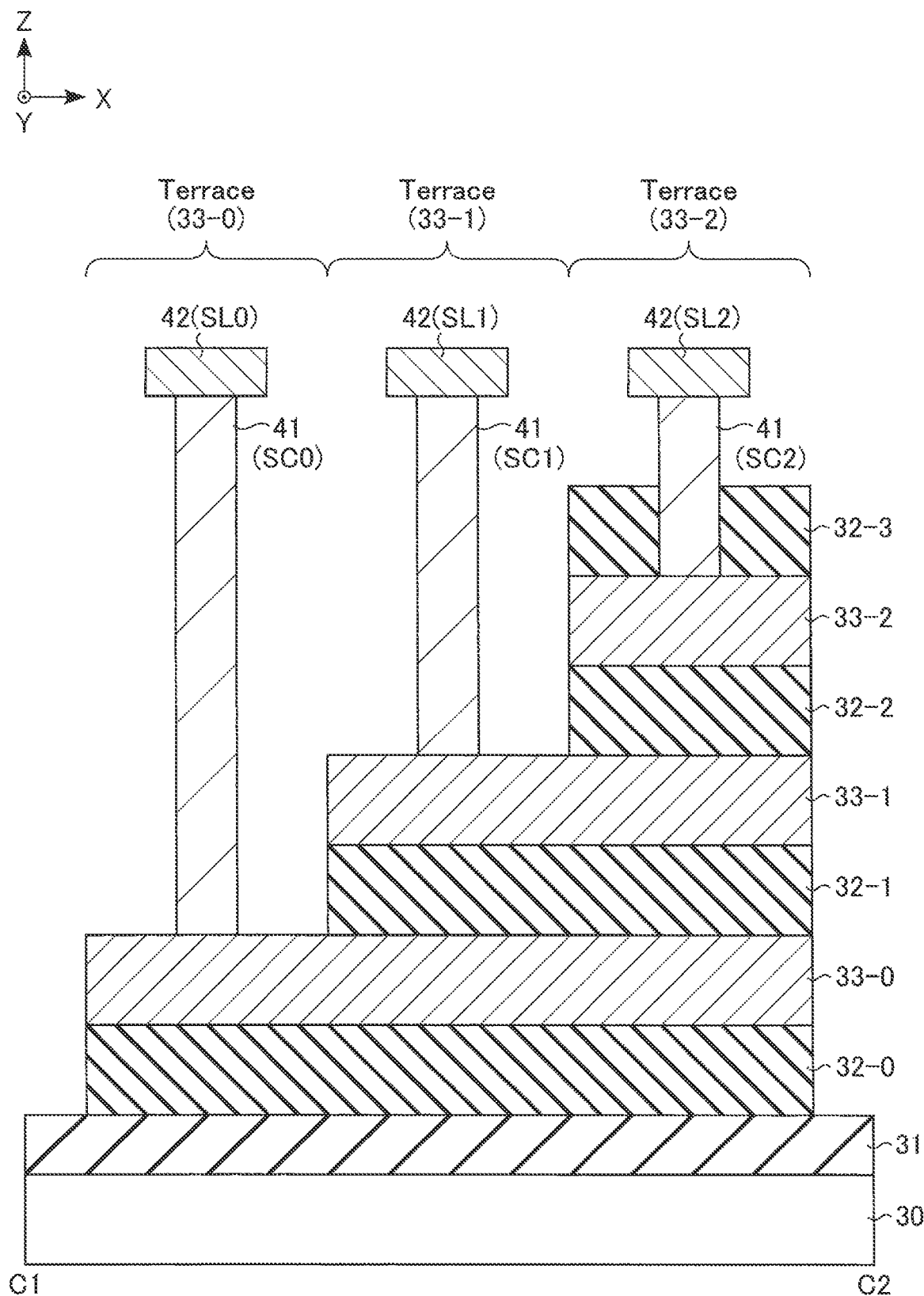
FIG. 22 is a cross-sectional view taken along line C1-C2 of FIG. 21.

Next, an example of a cross-sectional configuration of the memory cell array 10 will be described with reference to FIG. 22. FIG. 22 is a cross-sectional view taken along line C1-C2 of FIG. 21.

As shown in FIG. 22, in the SL coupling part, the semiconductor layers 33-0 to 33-2 are drawn out in a staircase shape in the X direction, each having a portion (hereinafter, referred to as a "terrace") which does not overlap the upper semiconductor layers 33. The contact plug SC0 is provided on the terrace of the semiconductor layer 33-0, and is not electrically coupled to the semiconductor layers 33-1 to 33-2. Similarly, the contact plug SC1 is provided on the terrace of the semiconductor layer 33-1, and is not electrically coupled to the semiconductor layers 33-0 and 33-2. The contact plug SC2 is provided on the terrace of the semiconductor layer 33-2, and is not electrically coupled to the semiconductor layers 33-0 and 33-1. The contact plugs SC0 to SC2 are filled with the conductor 41. On the contact plugs SC0 to SC2, the interconnect layers 42 which function as the source lines SL0 to SL2, respectively, are provided.

In the example of FIG. 22, a case where the terraces are provided for the semiconductor layers 33-0 to 33-2 in the SL coupling part is described, but the configuration is not limited thereto. For example, the terraces may not be provided for the semiconductor layers 33-0 to 33-2. In this case, the contact plugs SC0 to SC2 may be coupled to the semiconductor layers 33-0 to 33-2 by the same coupling method as that of the contact plugs BC0 to BC2.

6.5 Advantageous Effect of Present Embodiment

With the configuration according to the present embodiment, the same advantageous effect as that of the first embodiment can be obtained.

Further, with the configuration according to the present embodiment, a memory string MS to be a target of the write operation and the read operation can be selected by selecting a source line SL.

The present embodiment can be combined with the second to fifth embodiments to the extent possible.

7. Seventh Embodiment

Next, a seventh embodiment will be described. In the seventh embodiment, a case where a select transistor is provided between a selector SW and a source line SL will be described. Hereinafter, points different from the first to sixth embodiments will be mainly described.

7.1 Circuit Configuration of Memory Cell Array

Figure 23:
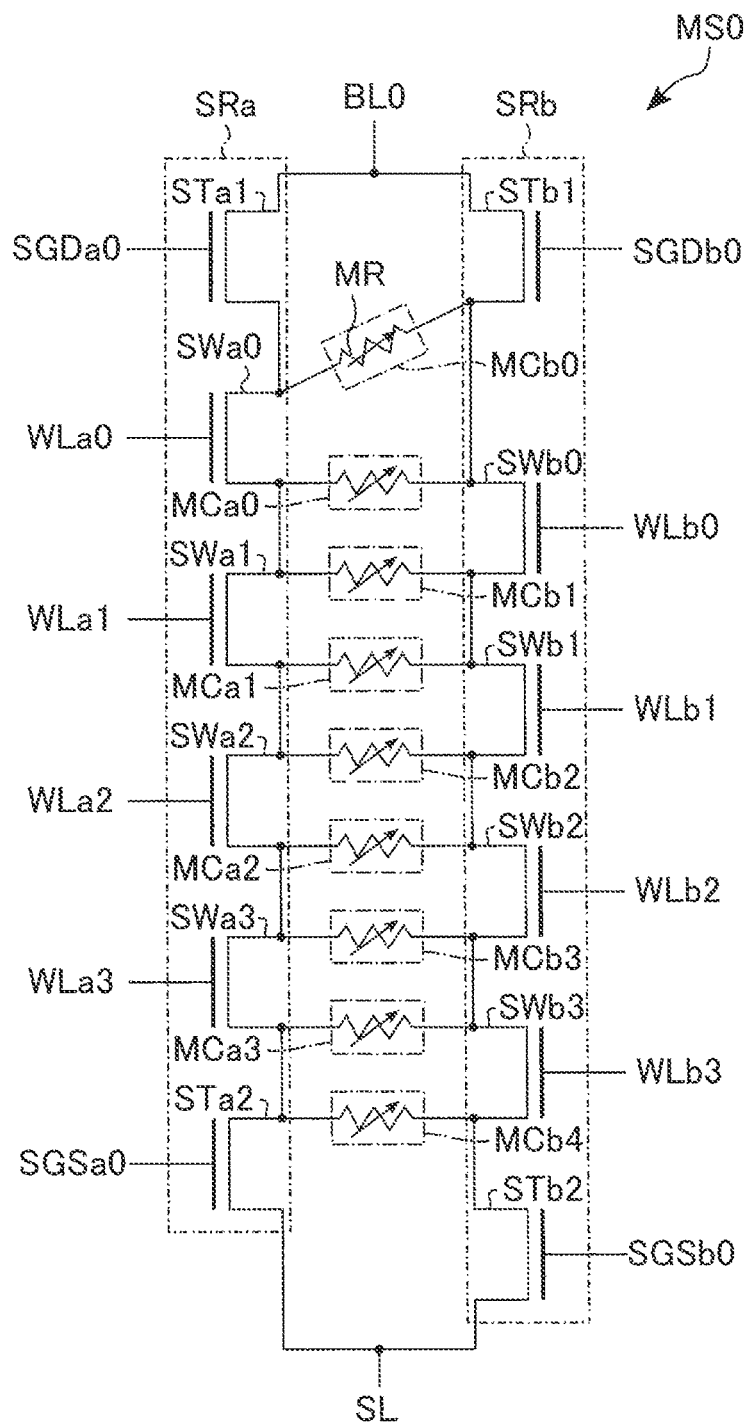
FIG. 23 is a circuit diagram of a memory cell array included in a memory device according to a seventh embodiment.

First, an example of a circuit configuration of the memory cell array 10 will be described with reference to FIG. 23. FIG. 23 shows a circuit configuration of the memory string MS0. The other memory strings MS also have the same configuration.

As shown in FIG. 23, the memory string MSC includes two strings SRa and SRb, and a plurality of memory cells MC (nine memory cells MCa0 to MCa3 and MCb0 to MCb4 in the example of FIG. 23) provided between the strings SRa and SRb.

The string SRa includes select transistors STa1 and STa2 and four selectors SWa0 to SWa3. Similarly, the string SRb includes select transistors STb1 and STb2 and four selectors SWb0 to SWb3. The select transistors STa1 and STa2, and STb1 and STb2, are turned on when the corresponding string SR is selected.

More specifically, for example, in the string SRa, current paths of the select transistor STa1, selectors SWa0 to SWa3, and select transistor STa2 are coupled in series in this order. Similarly, in the string SRb, current paths of the select transistor STb1, selectors SWb0 to SWb3, and select transistor STb2 are coupled in series in this order. The drains of the select transistors STa1 and STb1 included in one memory string MS are coupled in common to one bit line BL. The sources of the select transistors STa2 and STb2 included in one memory string MS are coupled in common to a source line SL.

In each string unit SU, the gates of a plurality of select transistors STa2 are coupled in common to a select gate line SGSa, and the gates of a plurality of select transistors STb2 are coupled in common to a select gate line SGSb. More specifically, for example, in the string unit SU0, the gates of a plurality of select transistors STa2 are coupled in common to a select gate line SGSa0, and the gates of a plurality of select transistors STb2 are coupled in common to a select gate line SGSb0.

In each string unit SU, the select gate lines SGSa and SGSb are independently controlled by the row decoder module 15.

In the present embodiment, when a current is passed from a bit line BL to a source line SL via a memory string MS, the memory cells MCa0 to MCa3 are provided on a current path for passing the current from the string SRa to the string SRb. Further, the memory cells MCb0 to MCb4 are provided on a current path for passing a current from the string SRb to the string SRa. More specifically, when a current is passed from the string SRa to the string SRb, the memory cell MCa0 is provided on a current path connecting the source of the selector SWa0 and the drain of the selector SWb0. The memory cell MCa1 is provided on a current path connecting the source of the selector SWa1 and the drain of the selector SWb1. The memory cell MCa2 is provided on a current path connecting the source of the selector SWa2 and the drain of the selector SWb2. The memory cell MCa3 is provided on a current path connecting the source of the selector SWa3 and the drain of the selector SWb3. When a current is passed from the string SRb to the string SRa, the memory cell MCb0 is provided on a current path connecting the source of the select transistor STb1 and the drain of the selector SWa0. The memory cell MCb1 is provided on a current path connecting the source of the selector SWb0 and the drain of the selector SWa1. The memory cell MCb2 is provided on a current path connecting the source of the selector SWb1 and the drain of the selector SWa2. The memory cell MCb3 is provided on a current path connecting the source of the selector SWb2 and the drain of the selector SWa3. The memory cell MCb4 is provided on a current path connecting the source of the selector SWb3 and the drain of the select transistor STa2.

7.2 Planar Configuration of Memory Cell Array

Figure 24:
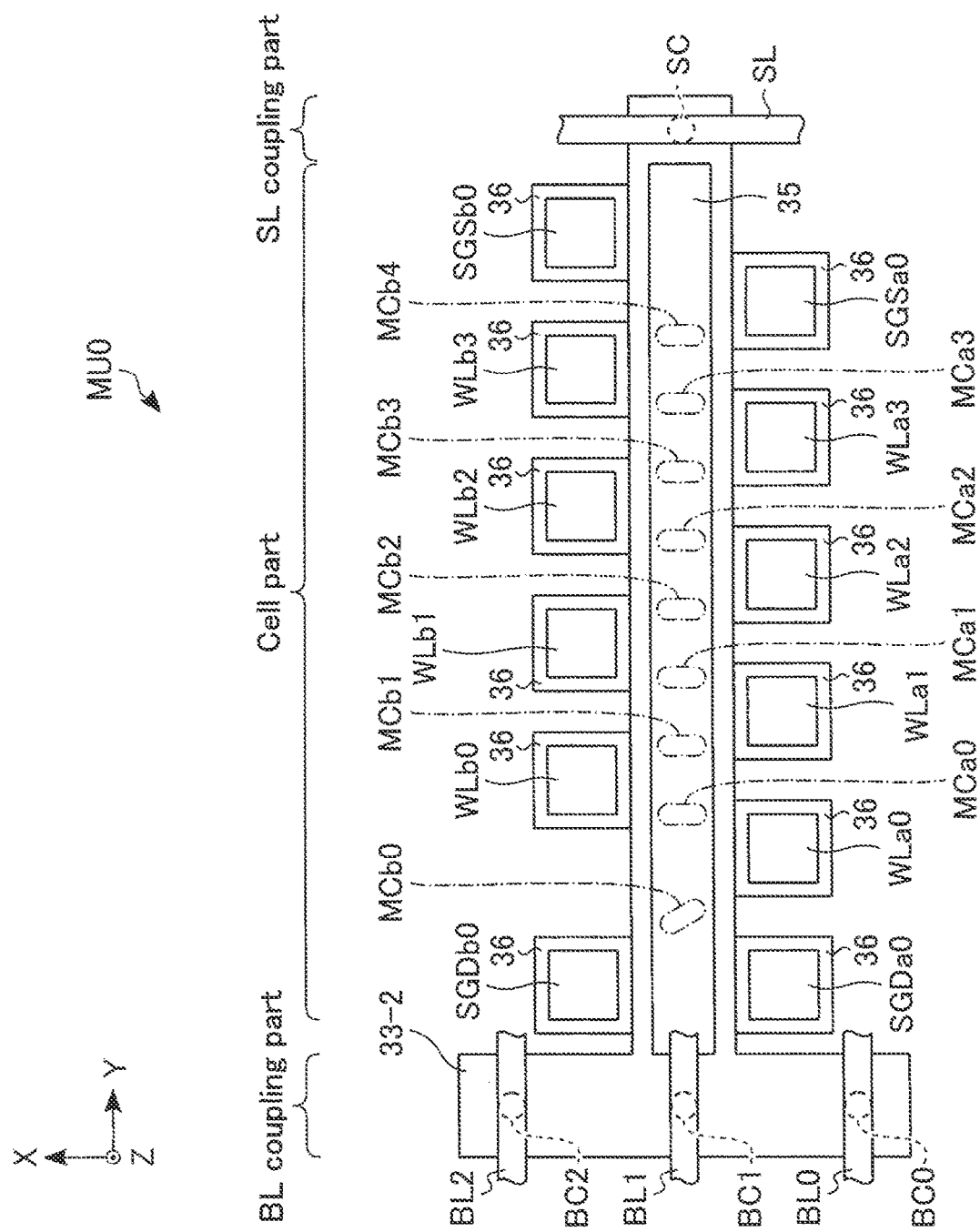
FIG. 24 is a plan view of the memory cell array included in the memory device according to the seventh embodiment.

Next, an example of a planar configuration of the memory cell array 10 will be described with reference to FIG. 24. FIG. 24 is a top view of the memory unit MU0. In the example of FIG. 24, some of the insulating layers are omitted.

As shown in FIG. 24, the select gate line SGDa0, word lines WLa0 to WLa3, and select gate line SGSa0 are aligned in the Y direction so that the corresponding insulating layers 36 are in contact with one side surface of the laminate 34 facing the X direction. Similarly, the select gate line SGDb0, word lines WLb0 to WLb3, and select gate line SGSb0 are aligned in the Y direction so that the corresponding insulating layers 36 are in contact with the other side surface of the laminate 34 facing the X direction. The word lines WLa0 to WLa3 and select gate line SGSa0, and the word lines WLb0 to WLb3 and select gate line SGSb0, are arranged so as to be in a two-row staggered arrangement toward the Y direction with the laminate 34 interposed therebetween.

More specifically, for example, the select gate line SGDa0, word lines WLa0 to WLa3, and select gate line SGSa0 are arranged at approximately equal intervals along the Y direction. In this state, the word line WLb0 is arranged between the word lines WLa0 and WLa1 in the Y direction, and is arranged at a position different from the word lines WLa0 and WLa1 in the X direction. In other words, the word line WLb0 is arranged so as to be adjacent to the word lines WLa0 and WLa1 with the laminate 34 interposed (sandwiched) therebetween. Similarly, the word line WLb1 is arranged between the word lines WLa1 and WLa2 in the Y direction. The word line WLb2 is arranged between the word lines WLa2 and WLa3 in the Y direction. The word line WLb3 is arranged between the word line WLa3 and the select gate line SGSa0 in the Y direction. The select gate line SGSb0 is arranged between the select gate line SGSa0 and the source line SL (contact plug SC) in the Y direction. A distance between the select gate line SGDb0 and the word line. WLb0 is longer than a distance between the word lines WLb aligned in the Y direction. Further, a distance between the select gate line SGDb0 and the word line WLb0 is longer than the distance between the select gate line SGDa0 and the word line WLa0. For example, the word lines WLb0 to WLb3 and the select gate line SGSb0 are arranged at approximately equal intervals along the Y direction. A distance between the select gate line SGSa0 and the contact plug SC in the Y direction is longer than a distance between the select gate line SGSb0 and the contact plug SC.

In the present embodiment, each memory cell MC is structurally not separated. In the variable resistance layer 35, a region corresponding to the shortest path connecting the select gate line SGDb0 and the word line WLa0 functions as the memory cell MCb0 (memory element MR). Similarly, in the variable resistance layer 35, a region corresponding to the shortest path connecting the word lines WLa0 and WLb0 functions as the memory cell MCa0. In the variable resistance layer 35, a region corresponding to the shortest path connecting the word lines WLb0 and WLa1 functions as the memory cell MCb1. In the variable resistance layer 35, a region corresponding to the shortest path connecting the word lines WLa1 and WLb1 functions as the memory cell MCa1. In the variable resistance layer 35, a region corresponding to the shortest path connecting the word lines WLb1 and WLa2 functions as the memory cell MCb2. In the variable resistance layer 35, a region corresponding to the shortest path connecting the word lines WLa2 and WLb2 functions as the memory cell MCa2. In the variable resistance layer 35, a region corresponding to the shortest path connecting the word lines WLb2 and WLa3 functions as the memory cell MCb3. In the variable resistance layer 35, a region corresponding to the shortest path connecting the word lines WLa3 and WLb3 functions as the memory cell MCa3. In the variable resistance layer 35, a region corresponding to the shortest path connecting the word line WLb3 and the select gate line SGSa0 functions as the memory cell MCb4.

In the structure shown in FIG. 23 and FIG. 24, the select transistors STa1 and STb1 are arranged to face each other in the X direction, and the select transistors STa2 and STb2 are arranged to face each other in the oblique direction. However, the structure is not limited thereto. The select transistors STa2 and STb2 may be arranged to face each other in the X direction similarly to the arrangement of the select transistors STa1 and STb1.

7.3 Voltages of Interconnects in Write Operation and Read Operation

Next, an example of voltages of the interconnects in the write operation and the read operation will be described with reference to FIG. 25. FIG. 25 is a timing chart of an operation waveform.

As shown in FIG. 25, for example, the sequencer 13 applies the same voltage as that of the select gate line SGD to the select gate line SGS in the write operation and the read operation. Voltages of the word lines WL, bit lines BL, and a source line SL are the same as those in FIG. 11 of the first embodiment.

7.4 Advantageous Effect of Present Embodiment

With the configuration according to the present embodiment, the same advantageous effect as that of the first embodiment can be obtained.

The present embodiment can be combined with the second to sixth embodiments to the extent possible. That is, the select transistors STa2 and STb2 can be provided also in the memory string MS configurations described in the second to sixth embodiments.

8. Eighth Embodiment

Next, an eighth embodiment will be described. In the eighth embodiment, a case where the word lines WL extend in a direction parallel to the semiconductor substrate 30 and the semiconductor layers and the variable resistance layer extend in the Z direction perpendicular to the semiconductor substrate will be described.

8.1 Overall Configuration of Memory Device

First, an overall configuration of a memory device will be described with reference to FIG. 26. FIG. 26 is an example of a block diagram showing a basic overall configuration of the memory device.

As shown in FIG. 26, in the present embodiment, in the memory cell array 10, a group called a memory unit MU is not provided in a string unit SU. Each of the string units SU includes a plurality of memory strings MS.

8.2 Overall Configuration of Memory Cell Array

Figure 27:
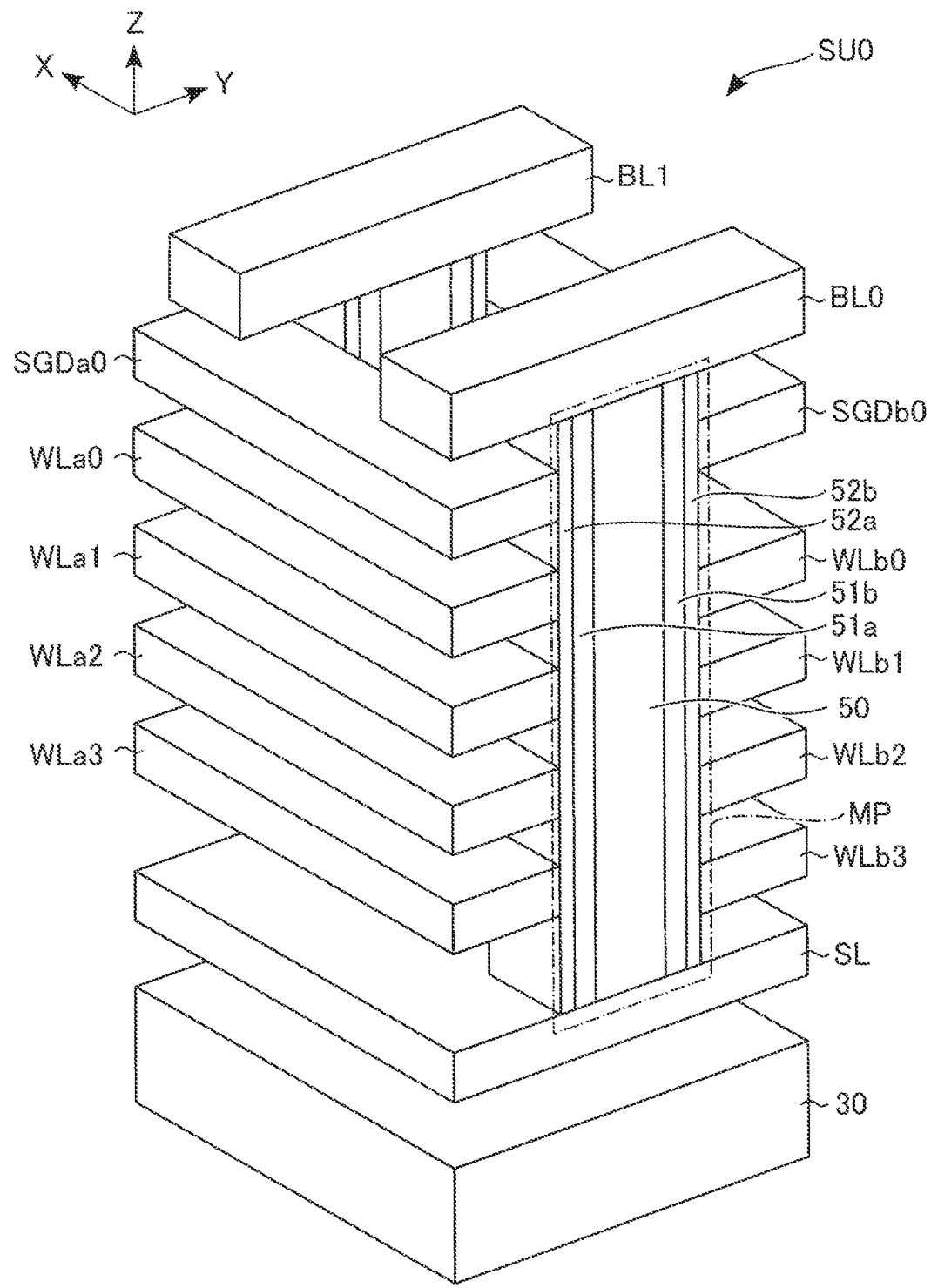
FIG. 27 is a perspective view of a memory cell array included in the memory device according to the eighth embodiment.

Next, an example of an overall configuration of the memory cell array 10 will be described with reference to FIG. 27. FIG. 27 shows a perspective view of the string unit SU0. In the example of FIG. 27, some of the insulating layers are omitted.

As shown in FIG. 27, a source line SL extending in an XY plane is formed above the semiconductor substrate 30. A plurality of memory pillars MP extending in the Z direction are aligned in the Y direction on the source line SL. One memory pillar MP corresponds to one memory string. The memory pillar MP includes a variable resistance layer 50, semiconductor layers 51a and 51b, and insulating layers 52a and 52b. More specifically, the variable resistance layer 50 extending in the Z direction is provided in the memory pillar MP. The semiconductor layer 51a is provided so that one side surface of the semiconductor layer 51a facing the Y direction is in contact with one side surface of the variable resistance layer 50 facing the Y direction. Similarly, the semiconductor layer 51b is provided so that one side surface of the semiconductor layer 51b facing the Y direction is in contact with the other side surface of the variable resistance layer 50 facing the Y direction. The insulating layer 52a is provided so as to be in contact with the other side surface of the semiconductor layer 51a facing the Y direction. The insulating layer 52b is provided so as to be in contact with the other side surface of the semiconductor layer 51b facing the Y direction.

The semiconductor layers 51a and 51b are areas where the select transistors ST1 and inversion layers (channel) of the selectors SW are formed. The insulating layers 52a and 52b function as gate insulating films of the select transistors ST1 and the selectors SW. An example of a material of the variable resistance layer 50 is the alloy-based phase-change memory ($Ge_2Sb_2Te_5$) described in the first embodiment, or the superlattice layer described in the fourth embodiment. For the semiconductor layers 51a and 51b, for example, polysilicon doped with impurities is used. For the insulating layers 52a and 52b, $SiO_2$ is used, for example.

Above the source line SL, the select gate line SGDa0 and word lines WLa0 to WLa3 extending in the X direction are separated in the Z direction, i.e., stacked with interlayer insulating films (not shown) interposed therebetween. The select gate line SGDa0 and the word lines WLa0 to WLa3 are in contact with one side surface (a side surface of the insulating layer 52a) of the memory pillar MP facing the Y direction. Similarly, above, the source line SL, the select gate line SGDb0 and word lines WLb0 to WLb3 extending in the X direction are separated in the Z direction, i.e., stacked with interlayer insulating films (not shown) interposed therebetween. The select gate line SGDb0 and word lines WLb0 to WLb3 are in contact with the other side surface (a side surface of the insulating layer 52b) of the memory pillar MP facing the Y direction.

The select gate lines SGDa0 and SGDb0 are provided at the same layer. In other words, the select gate lines SGDa0 and SGDb0 are arranged so as to be adjacent to each other in the X direction with the memory pillar MP interposed therebetween in the XY plane. Height positions of the word lines WLa0 to WLa3 and WLb0 to WLb3 in the Z direction are different from one another. Details of the arrangement of the select gate lines SGD and the word lines WL in the Z direction will be described later.

Different bit lines BL are respectively arranged on a plurality of memory pillars MP arranged along the X direction. The bit lines BL extend in the Y direction. The memory pillar MP may be coupled to the bit line BL via a contact plug.

8.3 Planar Configuration of Memory Cell Array

Figure 28:
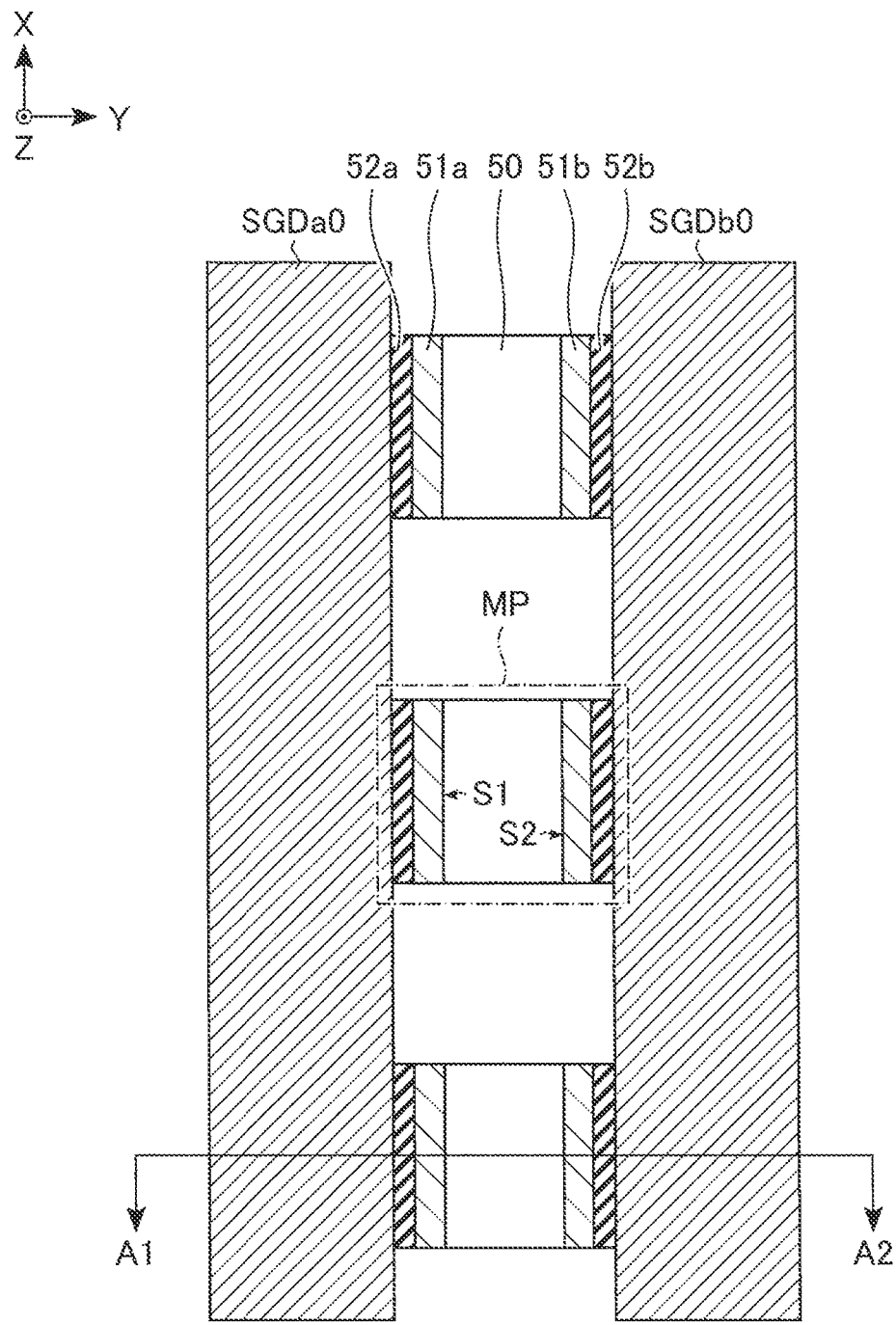
FIG. 28 is a plan view of the memory cell array included in the memory device according to the eighth embodiment.

Next, a planar configuration of the memory cell array 10 will be described with reference to FIG. 28. FIG. 28 is a top view of the select gate lines SGDa0 and SGDb0. In the example of FIG. 28, some of the insulating films are omitted.

As shown in FIG. 28, a plurality of memory pillars MF are aligned in the X direction between the select gate lines SGDa0 and SGDb0 extending in the X direction. In the memory pillar MP, the insulating layer 52a is provided on the side surface in contact with the select gate line SGDa0. Further, the insulating layer 52b is provided on the side surface in contact with the select gate line SGDb0. The semiconductor layer 51a is provided so as to be in contact with the insulating layer 52a. The semiconductor layer 51b is provided so as to be in contact with the insulating layer 52b. The variable resistance layer 50 is provided so that the two side, surfaces facing the Y direction are in contact with the semiconductor layers 51a and 51b, respectively. In other words, the variable resistance layer 50 extending in the Z direction is provided within the memory pillar MP. The semiconductor layer 51a is provided between a side surface S1 of the variable resistance layer 50 facing the Y direction and the select gate line SGDa0. Then, the insulating layer 52a is provided between the semiconductor layer 51a and the select gate line SGDa0. Similarly, the semiconductor layer 51b is provided between a side surface S2 of the variable resistance layer 50 facing the Y direction and the select gate line SGDb0. Then, the insulating layer S2b is provided between the semiconductor layer 51b and the select gate line SGDb0. Although this example shows the case where the memory pillar MP has a square pillar shape, the memory pillar MP may have a cylindrical shape.

8.4 Cross-Sectional Configuration of Memory Cell Array

Next, a cross-sectional configuration of the memory cell array 10 will be described with reference to FIG. 25. FIG. 29 is a cross-sectional view taken along line A1-A2 of FIG. 28.

As shown in FIG. 29, the insulating layer 31 is provided on the semiconductor substrate 30. On the insulating layer 31, an interconnect layer 53 which functions as a source line SL is provided. The interconnect layer 53 is made of a conductive material; for example, an N-type semiconductor, a P-type semiconductor, or a metal material is used.

The variable resistance layer 50 extending in the Z direction is provided on the interconnect layer 53. The semiconductor layer 51a extending in the Z direction is provided so as to be in contact with the side surface S1 of the variable resistance layer 50 facing the Y direction. Further, the semiconductor layer 51b extending in the Z direction is provided so as to be in contact with the side surface S2 of the variable resistance layer 50 facing the Y direction. Then, the insulating layer 52a is provided so that a side surface facing the Y direction is in contact with the semiconductor layer 51a. Similarly, the insulating layer 52b is provided so that a side surface facing the Y direction is in contact with the semiconductor layer 51b.

Further, above the interconnect layer 53, four interconnect layers 55a stacked in the Z direction with insulating layers 54 interposed therebetween are provided. The four interconnect layers 55a function as the word lines WLa0 to WLa3, respectively, from the upper layer. The interconnect layers 55a extend in the X direction. Side surfaces of the interconnect layers 55a facing the Y direction are in contact with the side surface of the insulating layer 52a. Similarly, above the interconnect layer 53, four interconnect layers 55b stacked in the Z direction with the insulating layers 54 interposed therebetween are provided. The four interconnect layers 55b function as the word lines WLb0 to WLb3, respectively, from the upper layer. The interconnect layers 55b extend in the X direction. Side surfaces of the interconnect layers 55b facing the Y direction are in contact with the side surface of the insulating layer 52b.

The interconnect layers 55a and 55b are different in position in the Z direction. More specifically, the positions in the Z direction are such that, the interconnect layers are arranged in the following order, starting from the lowest position (closest to the semiconductor substrate): the interconnect layer 55b which functions as the word line WLb3, the interconnect layer 55a which functions as the word line WLa3, the interconnect layer 55b which functions as the word line WLb2, the interconnect layer 55a which functions as the word line WLa2, the interconnect layer 55b which functions as the word line WLb1, the interconnect layer 55a which functions as the word line WLa1, the interconnect layer 55b which functions as the word line WLb0, and the interconnect layer 55a which functions as the word line WLa0.

In the Z direction, for example, a position of a top surface of the interconnect layer 55a and a position of a bottom surface of the interconnect layer 55b may be arranged so as to overlap, or be separated from, each other. The same applies to a relationship between a position of a bottom surface of the interconnect layer 55a and a position of a top surface of the interconnect layer 55b.

Above the uppermost interconnect layer 55a (word line WLa0), an interconnect layer 56a which functions as the select gate line SGDa0 is provided with the insulating layer 54 interposed therebetween. Similarly, above the uppermost interconnect layer 55b (word line WLb0), an interconnect layer 56b which functions as the select gate line SGDb0 is provided with the insulating layer 54 interposed therebetween. The interconnect layers 56a and 56b are, for example, provided at the same layer. In other words, a position of the interconnect layer 56a in the Z direction is approximately the same as a position of the interconnect layer 56b in the Z direction.

The insulating layer 54 is provided on the interconnect layers 56a and 56b. On the uppermost insulating layer 54 and the memory pillar MP, an interconnect layer 60 extending in the Y direction and functioning as a bit line BL is provided so as to be in contact with the semiconductor layers 51a and 51b.

For the insulating layer 54, for example, $SiO_2$ is used. The interconnect layers 53, 55a, 55b, 56a, 56b, and 60 are made of a conductive material; for example, an N-type semiconductor, a P-type semiconductor, or a metal material is used.

In the present embodiment, each memory cell MC is structurally not separated. In the variable resistance layer 50, a region corresponding to the shortest path connecting the select gate line SGDb0 and the word line WLa0 functions as the memory cell MCb0 (memory element MR). Similarly, in the variable resistance layer 50, a region corresponding to the shortest path connecting the word lines WLa0 and WLb0 functions as the memory cell MCa0. In the variable resistance layer 50, a region corresponding to the shortest path connecting the word lines WLb0 and WLa1 functions as the memory cell MCb1. In the variable resistance layer 50, a region corresponding to the shortest path connecting the word lines WLa1 and WLb1 functions as the memory cell MCa1. In the variable resistance layer 50, a region corresponding to the shortest path connecting the word lines WLb1 and WLa2 functions as the memory cell MCb2. In the variable resistance layer 50, a region corresponding to the shortest path connecting the word lines WLa2 and WLb2 functions as the memory cell MCa2. In the variable resistance layer 50, a region corresponding to the shortest path connecting the word lines WLb2 and WLa3 functions as the memory cell MCb3. Further, in the variable resistance layer 50, a region not corresponding to the memory cell MC (memory element MR) is set to a high resistance state (initial state).

8.5 Advantageous Effect of Present Embodiment

With the configuration according to the present embodiment, the same advantageous effect as that of the first embodiment can be obtained.

The present embodiment can be combined with the second to seventh embodiments to the extent possible.

9. Ninth Embodiment

Next, a ninth embodiment will be described. In the ninth embodiment, a case where two word lines WLa and WLb are provided at the same layer in the eighth embodiment will be described. Hereinafter, points different from the eighth embodiment will be mainly described.

9.1 Circuit Configuration of Memory Cell Array

First, an example of a circuit configuration of the memory cell array 10 will be described with reference to FIG. 30. FIG. 30 shows a circuit configuration of the memory string MS0. The other memory strings MS also have the same configuration.

As shown in FIG. 30, the memory string MS of the present embodiment includes two strings SRa and SRb, and a plurality of memory cells MC provided (four memory cells MC0 to MC3 in the example of FIG. 30) between the strings SRa and SRb.

The configurations of the memory strings SRa and SRb are the same as those of the first embodiment.

In the present embodiment, a current path connecting the source of the select transistor STa1 and the selector SWb0, and a current path connecting the source of the select transistor STb1 and the selector SWa0, are common. Then, the memory cell MC0 is provided in this common region. Similarly, a current path connecting the source of the selector SWa0 and the drain of the selector SWb1, and a current path connecting the source of the selector SWb0 and the drain of the selector SWa1, are common. Then, the memory cell MC1 is provided in this common region. A current path connecting the source of the selector SWa1 and the drain of the selector SWb2, and a current path connecting the source of the selector SWb1 and the drain of the selector SWa2, are common. Then, the memory cell MC2 is provided in this common region. A current path connecting the source of the selector SWa2 and the drain of the selector SWb3, and a current path connecting the source of the selector SWb2 and the drain of the selector SWa3, are common. Then, the memory cell MC3 is provided in this common region.

9.2 Overall Configuration of Memory Cell Array

Figure 31:
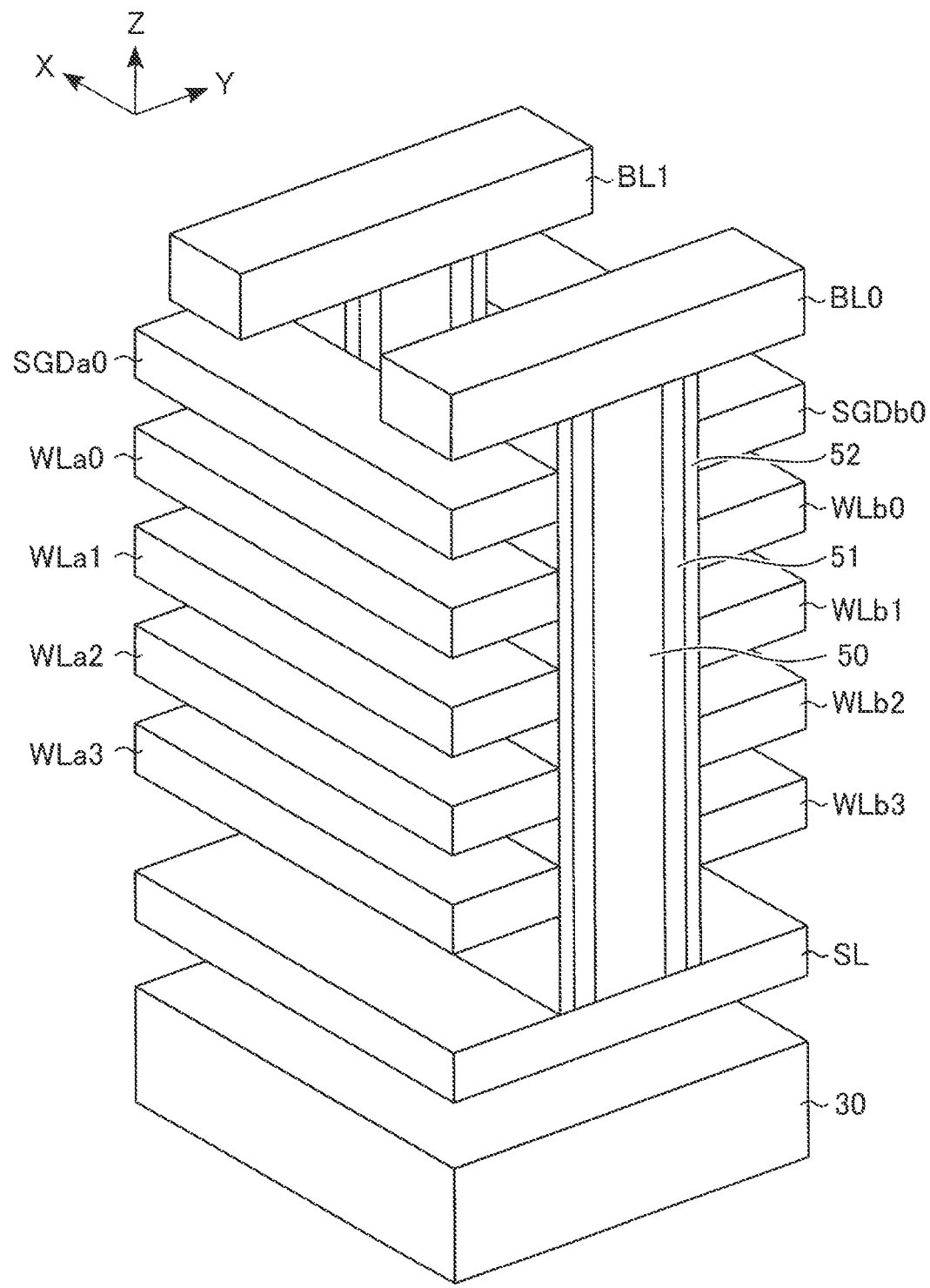
FIG. 31 is a perspective view of the memory cell array included in the memory device according to the ninth embodiment.

Next, an example of an overall configuration of the memory cell array 10 will be described with reference to FIG. 31. FIG. 31 shows a perspective view of a string unit SU. In the example of FIG. 31, some of the insulating layers are omitted.

As shown in FIG. 31, the word lines WLa0 and WLb0 are arranged at the same layer. The word lines WLa1 and WLb1 are arranged at the same layer. The word lines WLa2 and WLb2 are arranged at the same layer. The word lines WLa3 and WLb3 are arranged at the same layer.

9.3 Cross-Sectional Configuration of Memory Cell Array

Figure 32:
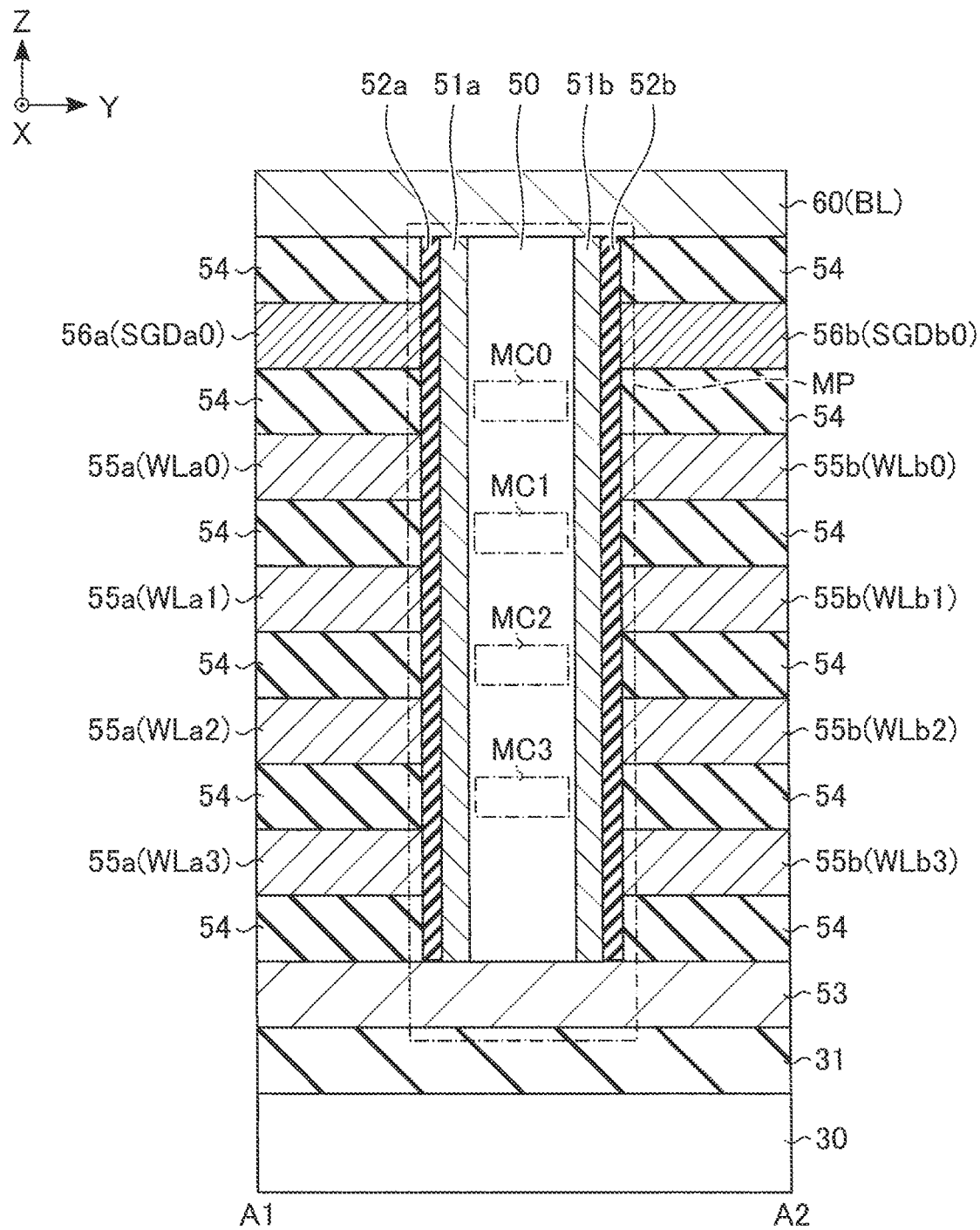
FIG. 32 is a cross-sectional view of the memory cell array included in the memory device according to the ninth embodiment.

Next, a cross-sectional configuration of the memory cell array 10 will be described with reference to FIG. 32. FIG. 32 is a cross-sectional view taken along line A1-A2 of FIG. 28.

As shown in FIG. 32, positions of the interconnect layers 55a and 55b are approximately equal in the Z direction. More specifically, positions of the interconnect layer 55a which functions as the word line WLa3 and the interconnect layer 55b which functions as the word line WLb3 are approximately equal in the Z direction. Positions of the interconnect layer 55a which functions as the word line WLa2 and the interconnect layer 55b which functions as the word line WLb2 are approximately equal in the Z direction. Positions of the interconnect layer 55a which functions as the word line WLa1 and the interconnect layer 55b which functions as the word line WLb1 are approximately equal in the Z direction. Positions of the interconnect layer 55a which functions as the word line WLa0 and the interconnect layer 55b which functions as the word line WLb0 are approximately equal in the Z direction.

In the variable resistance layer 50, a region between the select gate lines SGDa0 and SGDb0 and the word lines WLa0 and WLb0 functions as the memory cell MC0. Similarly, in the variable resistance layer 50, a region between the word lines WLa0 and WLb0 and the word lines WLa1 and WLb1 functions as the memory cell MC1. In the variable resistance layer 50, a region between the word lines WLa1 and WLb1 and the word lines WLa2 and WLb2 functions as the memory cell MC2. In the variable resistance layer 50, a region between the word lines WLa2 and WLb2 and the word lines WLa1 and WLb3 functions as the memory cell MC3. Further, in the variable resistance layer 50, a region not corresponding to the memory cell MC (memory element MR) is set to a high resistance state (initial state).

9.4 Selection Operation of Memory Cell

Next, a selection operation of the memory cell MC in the write operation and the read operation will be described with reference to FIG. 33. FIG. 33 is a circuit diagram of the memory string MS0 showing a state in which the memory cell MC1 is selected.

As shown in FIG. 33, for example, when a memory cell MC to be selected is MC1, any one of two current paths can be selected. For example, when the select transistor STa1 is set to a selected state (ON state), in the string SRa, the select transistor STa1 and the selector SWa0 are turned on, and the selectors SWa1 to SWa3 are turned off. Then, in the string SRb, the select transistor STb1 and the selector SWb0 are turned off, and the selectors SWb1 to SWb3 are turned on. As a result, as indicated by the solid lines in FIG. 33, a current flows from the bit line BL0 into the variable resistance layer 50 corresponding to the memory cell MC1 via the inversion layers (semiconductor layer 51a) of the select transistor STa1 and the selector SWa0. Then, the current having passed through the memory cell MC1 (variable resistance layer 50) flows to the source line SL via the inversion layer (semiconductor layer 51b) of the selectors SWb1 to SWb3.

On the other hand, when the select transistor STb1 is set to a selected state (ON state), in the string SRa, the select transistor STa1 and the selector SWa0 are turned off, and the selectors SWa1 to SWa3 are turned on. Then, in the string SRb, the select transistor STb1 and the selector SWb0 are turned on, and the selectors SWb1 to SWb3 are turned off. As a result, as indicated by the broken lines in FIG. 33, a current flows from the bit line BL0 into the variable resistance layer 50 corresponding to the memory cell MC1 via the inversion layers (semiconductor layer 51b) of the select transistor STb1 and the selector SWb0. Then, the current, having passed through the memory cell MC1 (variable resistance layer 50) flows to the source line SL via the inversion layer (semiconductor layer 51a) of the selectors SWa1 to SWa3.

At the time of the read operation and the write operation, a memory cell MC can be selected by selecting any one of the two current paths.

9.5 Advantageous Effect of Present Embodiment

With the configuration according to the present embodiment, the word lines WL can be arranged on the two opposite side surfaces of the semiconductor layer 33 provided with the variable resistance layer 35 inside, and each of the word lines WL can be independently controlled. Thereby, the memory cells MC (memory elements MR) can be arranged corresponding to a current path of a current passing through the variable resistance layer 35.

Further, with the configuration according to the present embodiment, when one memory cell MC is selected, any one of two current paths can be selected. Thereby, for example, when a conduction failure occurs in any one of the select gate lines SGD or the word lines WL, a target memory cell MC can be selected by switching the current path. Therefore, the reliability of the memory device can be improved.

10. Modification, Etc.

According to above embodiment, a memory device includes: a first variable resistance layer (35) extending in a first direction (Y direction); a first semiconductor layer (33a) extending in the first direction and being in contact with a first main surface (S1) of the first variable resistance layer, the first main surface facing a second direction (X direction) intersecting the first direction; a second semiconductor layer (33b) extending in the first direction and being in contact with a second main surface (S2) of the first variable resistance layer, the second main surface facing the second direction; a first word line (WLa0) extending in a third direction (Z direction) intersecting the first and second directions; a second word line (WLa1) extending in the third direction and being adjacent to the first word line along the first direction; a third word line (WLb0) extending in the third direction, being adjacent to the first and second word lines with the first semiconductor layer, the first variable resistance layer, and the second semiconductor layer interposed therebetween, and provided between the first word line and the second word line in the first direction; a first insulating layer (36) provided between the first semiconductor layer and the first word line; a second insulating layer (36) provided between the first semiconductor layer and the second word line; and a third insulating layer (36) provided between the second semiconductor layer and the third word line. In the first variable resistance layer, a first region including a shortest path connecting the first word line and the third word line functions as a first memory cell (MCa0), and a second region including a shortest path connecting the third word line and the second word line functions as a second memory cell (MCb1).

By applying the embodiments described above, it is possible to provide a memory device which can achieve high integration.

The embodiments are not limited to the above-described aspects, but can be modified in various ways.

The term "couple" in the above-described embodiments includes indirect, coupling via a transistor, a resistor, etc.

The wording "approximately equal" in the above-described embodiments may include an error caused by a manufacturing variation, etc.

While some embodiments of the present invention have been described, these embodiments have been presented by way of example only and are not intended to limit the scope of the invention. These novel embodiments described herein may be embodied in a variety of other forms, and various omissions, substitutions, and changes can be made without departing from the spirit of the invention. These embodiments and modifications thereof are included in the scope and spirit of the invention and are included in the scope of the claimed inventions and their equivalents.

The invention claimed is:

1. A memory device comprising:
a first variable resistance layer extending in a first direction;
a first semiconductor layer extending in the first direction and being in contact with a first main surface of the first variable resistance layer, the first main surface facing a second direction intersecting the first direction;
a second semiconductor layer extending in the first direction and being in contact with a second main surface of the first variable resistance layer, the second main surface facing the second direction;
a first word line extending in a third direction intersecting the first and second directions;
a second word line extending in the third direction and being adjacent to the first word line along the first direction;
a third word line extending in the third direction, being adjacent to the first and second word lines with the first semiconductor layer, the first variable resistance layer, and the second semiconductor layer interposed therebetween, and provided between the first word line and the second word line in the first direction;
a first insulating layer provided between the first semiconductor layer and the first word line;
a second insulating layer provided between the first semiconductor layer and the second word line; and
a third, insulating layer provided between the second semiconductor layer and the third word line,
wherein
in the first variable resistance layer, a first region including a shortest path connecting the first word line and the third word line functions as a first memory cell, and a second region including a shortest path connecting the third word line and the second word line functions as a second memory cell.

2. The memory device according to claim 1, further comprising:
a first select gate line extending in the third direction and being adjacent to the first word line along the first direction;
a second select gate line extending in the third direction, being adjacent to the first select gate line with the first semiconductor layer, the first variable resistance layer, and the second semiconductor layer interposed therebetween in the second direction, and being adjacent to the third word line along the first direction;
a fourth insulating layer provided between the first semiconductor layer and the first select gate line; and
a fifth insulating layer provided between the second semiconductor layer and the second select gate line,
wherein in the first variable resistance layer, a third region including a shortest path connecting the second select gate line and the first word line functions as a third memory cell.

3. The memory device according to claim 2, wherein a distance between the first select gate line and the first word line is shorter than a distance between the second select gate line and the third word line.

4. The memory device according to claim 2, wherein a length of the second select gate line in the first direction is longer than a length of the first select gate line in the first direction.

5. The memory device according to claim 4, wherein a distance between the first select gate line and the first word line is equal to a distance between the second select gate line and the third word line.

6. The memory device according to claim 1, further comprising:
a first select gate line extending in the third direction and being adjacent to the first word line along the first direction;
a second select gate line extending in the third direction, being adjacent to the first select gate line with the first semiconductor layer, the first variable resistance layer, and the second semiconductor layer interposed therebetween, and in the first direction, being adjacent to the third word line and provided between the first select gate line and the first, word line;
a fourth insulating layer provided between the first semiconductor layer and the first select gate line; and
a fifth insulating layer provided between the second semiconductor layer and the second select gate line,
wherein
in the first variable resistance layer, a third region including a shortest path connecting the second select gate line and the first word line functions as a third memory cell.

7. The memory device according to claim 1, wherein the first variable resistance layer includes a superlattice layer as an interfacial phase-change memory (iPCM).

8. The memory device according to claim 7, wherein the first variable resistance layer contains at least GeTe, and one of $Sb_2Te_3$ and BiSbTe.

9. The memory device according to claim 1, further comprising:
a third semiconductor layer provided between the first word line and the second word line in the first direction and being in contact with the first semiconductor layer, wherein
a concentration of a dopant contained in the third semiconductor layer is higher than a concentration of the dopant contained in the first semiconductor layer.

10. The memory device according to claim 9, wherein the dopant is phosphorus (P).

11. The memory device according to claim 1, further comprising:
a fourth semiconductor layer extending in the first direction and provided so as to be separated from the first semiconductor layer in the third direction; and
a fifth semiconductor layer extending in the first direction and provided so as to be separated from the second semiconductor layer in the third direction.

12. The memory device according to claim 11, further comprising:
a second variable resistance layer extending in the first direction, provided so as to be separated from the first variable resistance layer in the third direction, including a third main surface facing the second direction that is in contact with the fourth semiconductor layer, and including a fourth main surface facing the second direction that is in contact with the fifth semiconductor layer,
wherein
in the second variable resistance layer, a fourth region including a shortest path connecting the first word line and the third word line functions as a fourth memory cell, and a fifth region including a shortest path connecting the third word line and the second word line functions as a fifth memory cell.

13. The memory device according to claim 11, wherein the first variable resistance layer is extending in the third direction;
the fourth semiconductor layer is in contact with the first main surface of the first variable resistance layer,
the fifth semiconductor layer is in contact with the second main surface of the first variable resistance layer, and
in the first variable resistance layer, a fourth region including a shortest path connecting the first word line and the third word line via the fourth semiconductor layer and the fifth semiconductor layer functions as a fourth memory cell, and a fifth region including a shortest path connecting the third word line and the second word line via the fourth semiconductor layer and the fifth semiconductor layer functions as a fifth memory cell.

14. The memory device according to claim 13, wherein a distance between the first semiconductor layer and the second semiconductor layer in the second direction is shorter than a distance between the first semiconductor layer and the fourth semiconductor layer in the third direction.

15. The memory device according to claim 11, further comprising:
a first bit line coupled to one end of the first semiconductor layer and a first end of the second semiconductor layer;
a second bit line coupled to a first end of the fourth semiconductor layer and a first end of the fifth semiconductor layer; and
a source line coupled to a second end of the first semiconductor layer, a second end of the second semiconductor layer, a second end of the fourth semiconductor layer, and a second end of the fifth semiconductor layer.

16. The memory device according to claim 11, further comprising:
a first bit line coupled to a first end of the first semiconductor layer and a first end of the second semiconductor layer;
a second bit line coupled to a first end of the fourth semiconductor layer and a first end of the fifth semiconductor layer;
a first source line coupled to a second end of the first semiconductor layer and a second end of the second semiconductor layer; and
a second source line coupled to a second end of the fourth semiconductor layer and a second end of the fifth semiconductor layer.

17. The memory device according to claim 1, further comprising:
a third select gate line extending in the third direction and provided in line with the first word line and the second word line along the first direction;
a fourth select gate line extending in the third direction, being adjacent to the third select gate line with the first semiconductor layer, the first variable resistance layer, and the second semiconductor layer interposed therebetween, and provided in line with the third word line along the first direction;
a sixth insulating layer provided between the first semiconductor layer and the third select gate line; and
a seventh insulating layer provided between the second semiconductor layer and the fourth select gate line.

18. The memory device, according to claim 17, further comprising:
a fourth word line extending in the third direction and being adjacent to the fourth select gate line along the first direction; and
an eighth insulating layer provided between the second semiconductor layer and the fourth word line,
wherein
in the first direction, the third select gate line is arranged between the fourth word line and the fourth select gate line.

19. The memory device according to claim 1, wherein, in a read operation of the first memory cell, a first voltage is applied to the first word line and the third word line, and a second voltage lower than the first voltage is applied to the second word line.

20. The memory device according to claim 19, wherein an inversion layer is formed in the first semiconductor layer or the second semiconductor layer based on the first voltage.

* * * * *